(12) United States Patent
Ozawa

(10) Patent No.: US 7,569,454 B2
(45) Date of Patent: Aug. 4, 2009

(54) SEMICONDUCTOR DEVICE MANUFACTURING METHOD USING STRIP-LIKE GATE ELECTRODE HARD MASKS FOR ION IMPLANTATION

(75) Inventor: Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/598,053

(22) Filed: Nov. 13, 2006

(65) Prior Publication Data

US 2007/0117314 A1 May 24, 2007

(30) Foreign Application Priority Data

Nov. 15, 2005 (JP) ............... 2005-330444

(51) Int. Cl.
*H01L 21/8242* (2006.01)
*H01L 21/31* (2006.01)
*H01L 21/336* (2006.01)

(52) U.S. Cl. .............. 438/257; 257/306; 257/314; 257/E21.179; 257/E21.422; 257/E21.18

(58) Field of Classification Search ............ 438/254, 438/257; 257/E21.179, E21.18, E21.422
See application file for complete search history.

(56) References Cited

U.S. PATENT DOCUMENTS 6,063,688 A 5/2000 Doyle et al.
6,207,490 B1 3/2001 Lee
6,358,827 B1 3/2002 Chen et al.
6,888,755 B2 * 5/2005 Harari ............... 365/185.02
2002/0195645 A1 * 12/2002 Takada et al. ............ 257/314

FOREIGN PATENT DOCUMENTS

JP 08-55920 2/1996

* cited by examiner

*Primary Examiner*—Matthew Smith
*Assistant Examiner*—Walter H Swanson
(74) *Attorney, Agent, or Firm*—Finnegan, Henderson, Farabow, Garrett & Dunner, L.L.P.

(57) ABSTRACT

A method of manufacturing a semiconductor device, comprises forming a gate insulating film on a surface of a semiconductor substrate, forming a first group of at least one strip-like gate electrode and a second group of strip-like gate electrodes on a surface of the gate insulating film, each strip-like gate electrode having a first face contacting the gate insulating film, a second face vertically extending from a long side of the first face and a third face curved and extending between the first and second faces, and a gap between the third faces of the adjacent gate electrode being narrower, at the surface of the gate insulating film, than a gap between the second faces of the adjacent gate electrode, and introducing dopant atoms into the surface of the semiconductor substrate through the gaps between the gate electrodes, thereby forming diffusion layers in the semiconductor substrate.

7 Claims, 13 Drawing Sheets

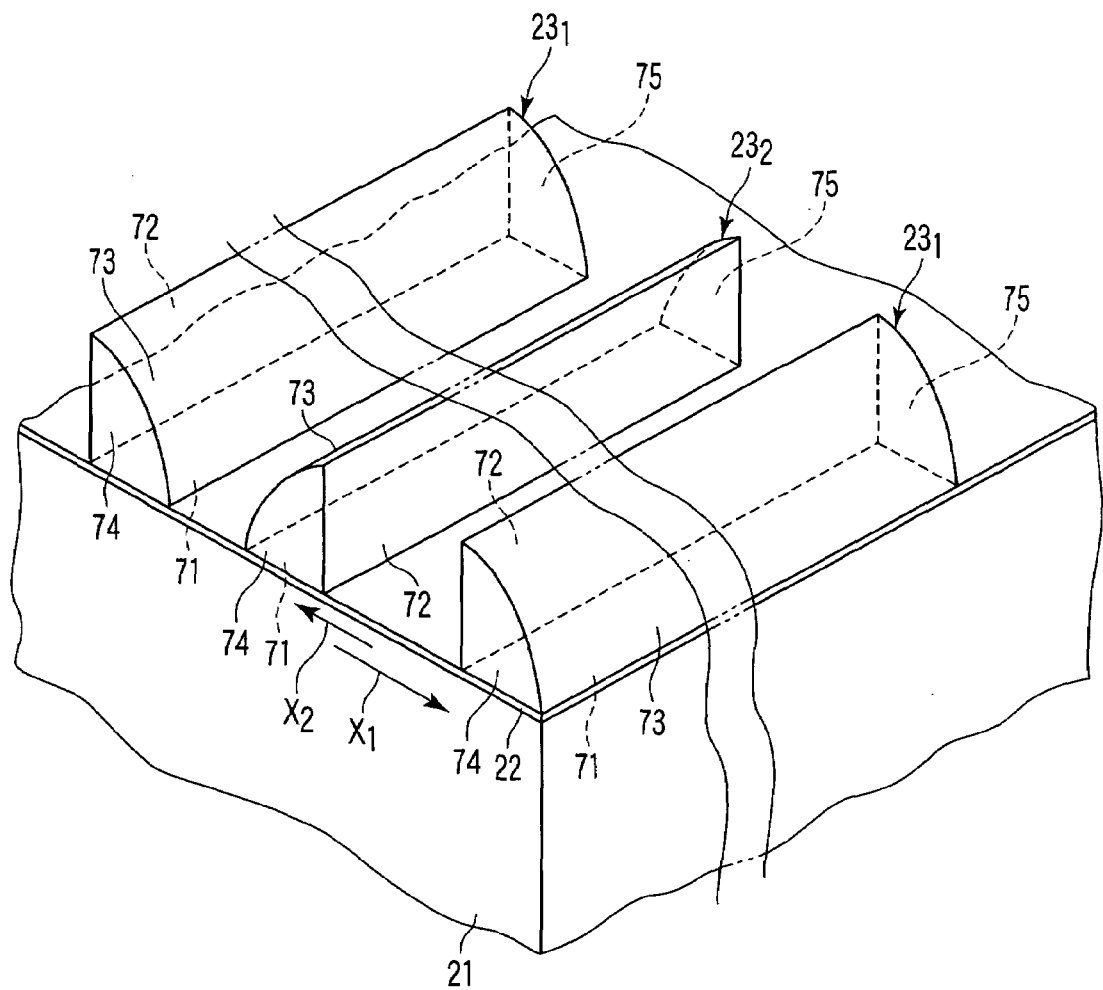
F I G. 12
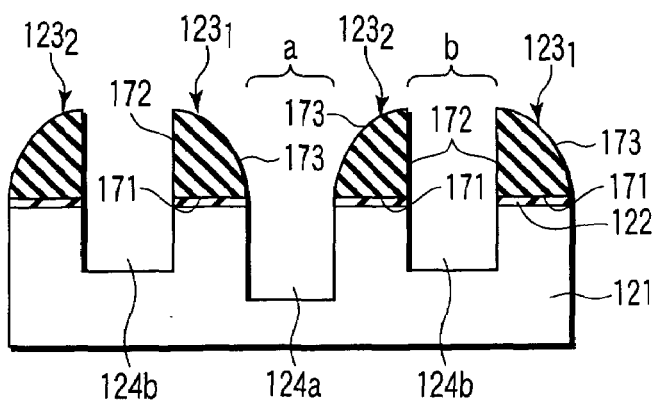
F I G. 13

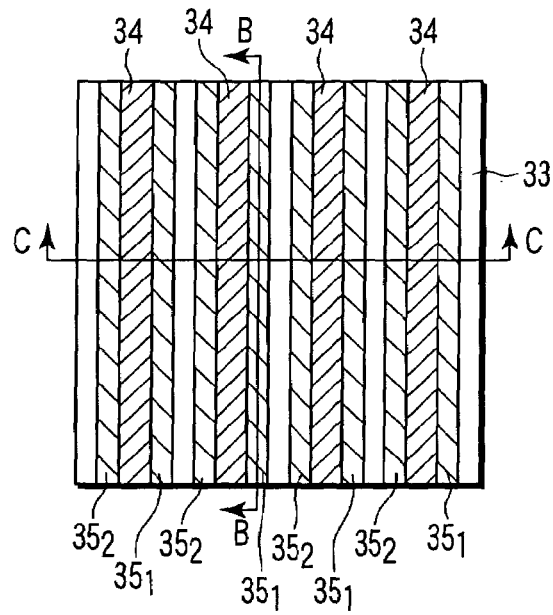
FIG. 14A1
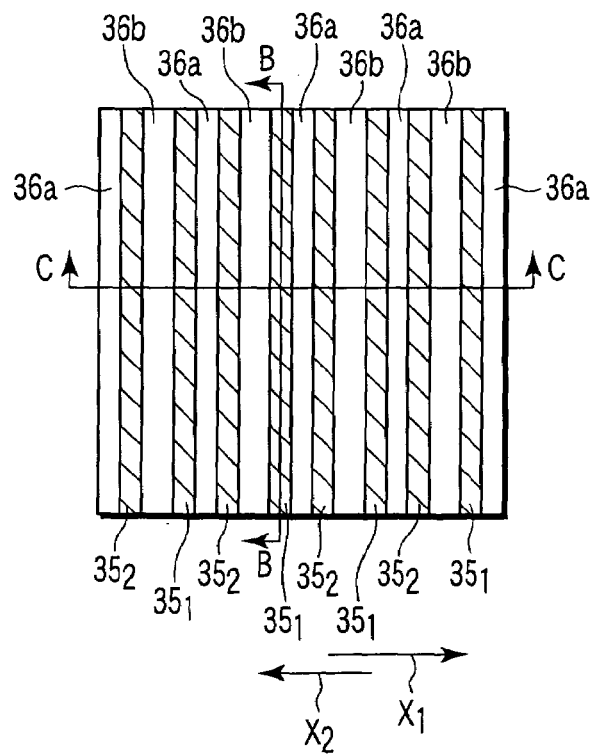
FIG. 14A2

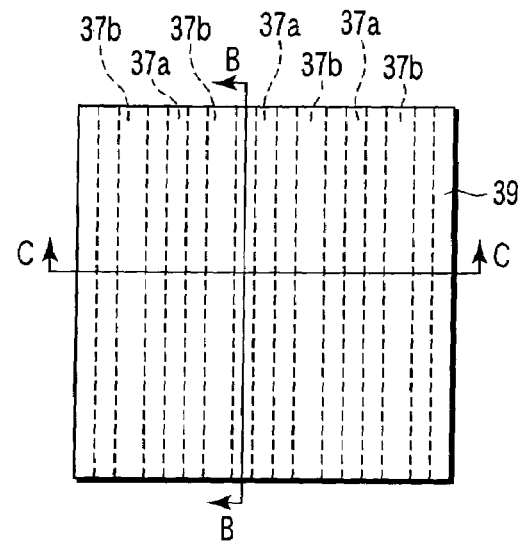
FIG. 14A3
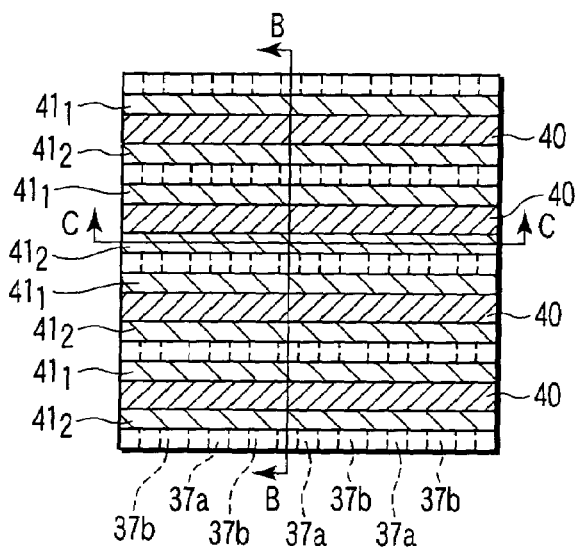
FIG. 14A4
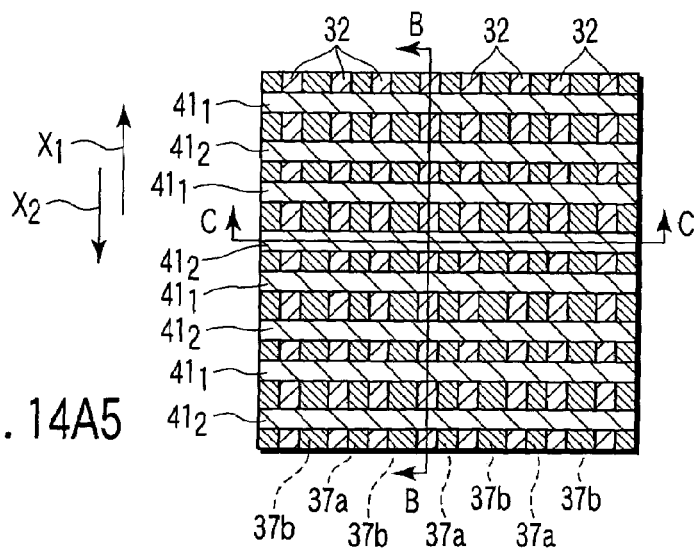
FIG. 14A5

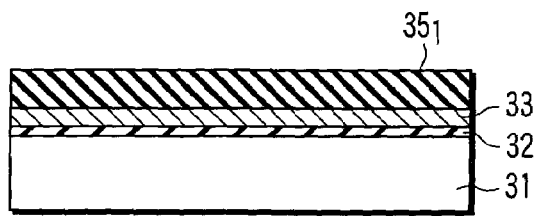
FIG. 15B1
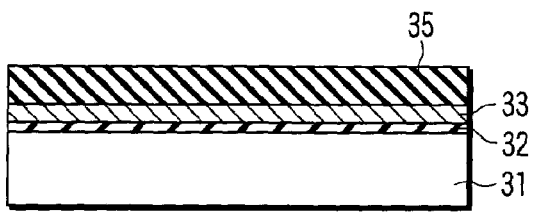
FIG. 15B2
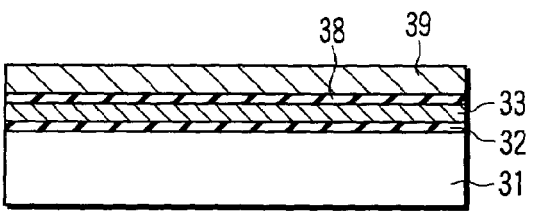
FIG. 15B3
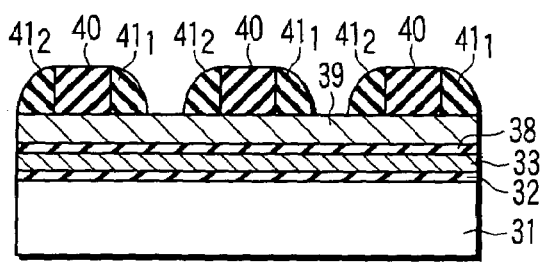
FIG. 15B4
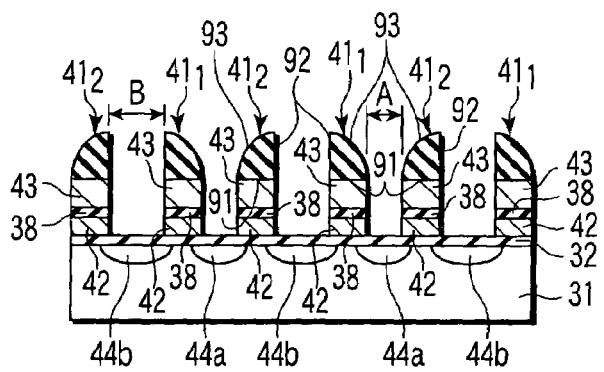
FIG. 15B5

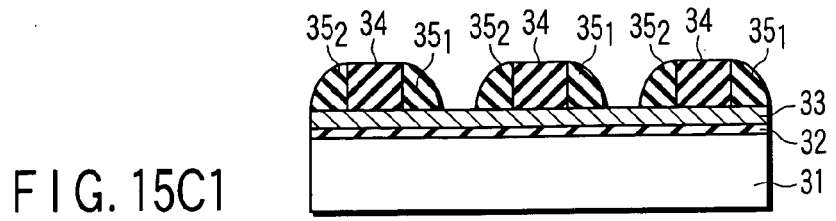
FIG. 15C1
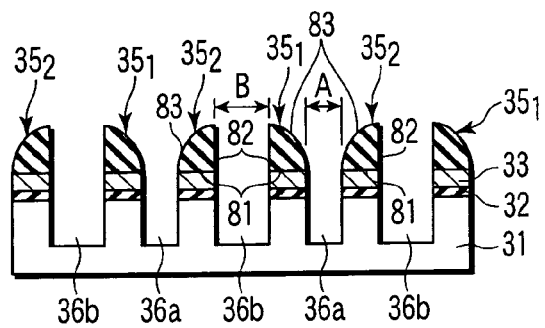
FIG. 15C2
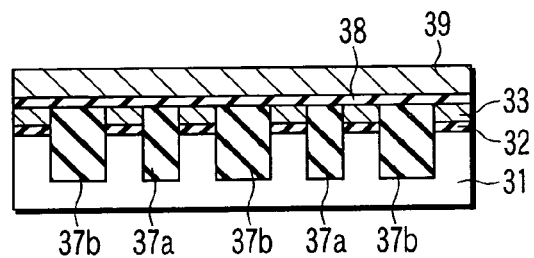
FIG. 15C3
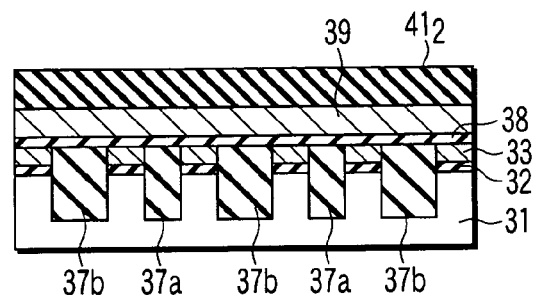
FIG. 15C4
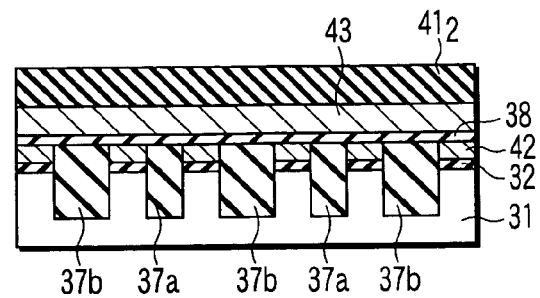
FIG. 15C5

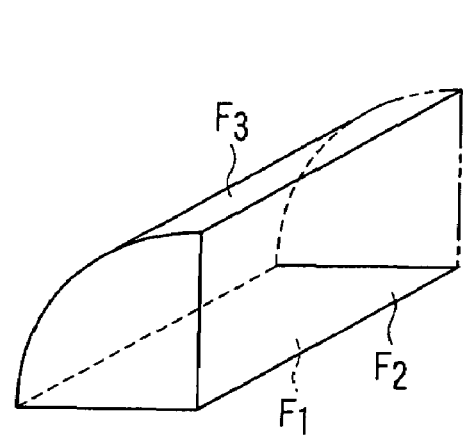
(a)
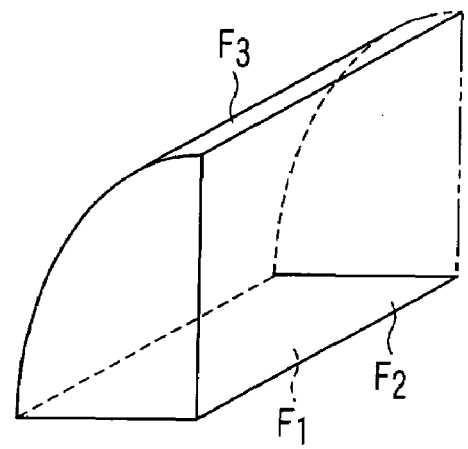
(b)
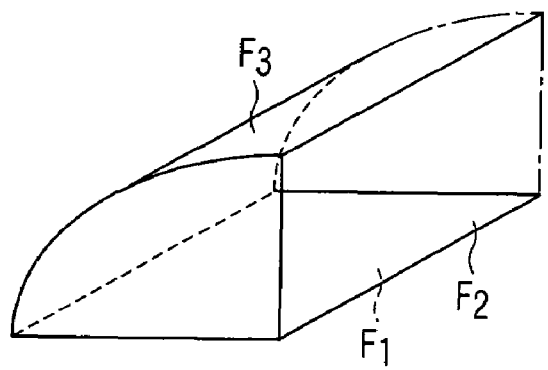
(c)
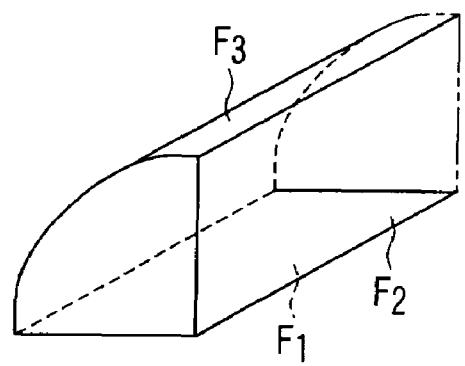
(d)
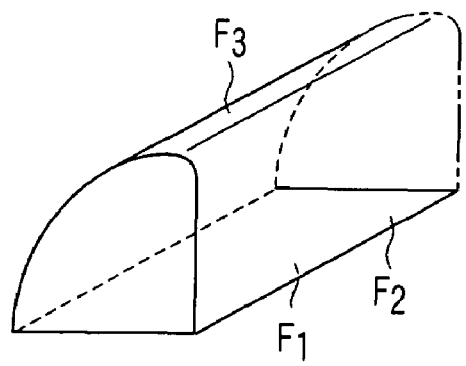
(e)
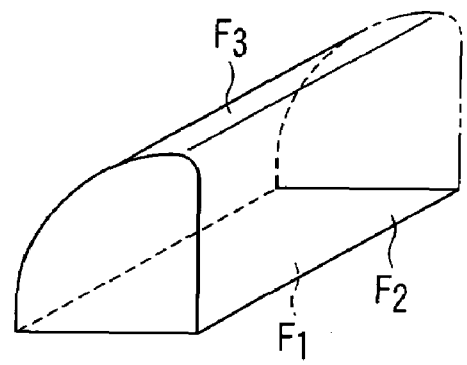
(f)
FIG. 17

SEMICONDUCTOR DEVICE MANUFACTURING METHOD USING STRIP-LIKE GATE ELECTRODE HARD MASKS FOR ION IMPLANTATION

CROSS-REFERENCE TO RELATED APPLICATIONS

This application is based upon and claims the benefit of priority from prior Japanese Patent Application No. 2005-330444, field Nov. 15, 2005, the entire contents of which are incorporated herein by reference.

BACKGROUND OF THE INVENTION

1. Field of the Invention

The present invention relates to a method of manufacturing a semiconductor device.

2. Description of the Related Art

U.S. Pat. No. 6,063,688 discloses a method of manufacturing a plurality of transistors of dimensions below the limits of lithographic techniques by forming gate electrodes and the like using processing hard masks formed on the sidewalls of dummy pattern structures.

Japanese Unexamined Patent Publication No. 8-55920 also discloses a method of manufacturing a plurality of transistors of dimensions below the limits of lithographic techniques, which involves forming a conductive film on a semiconductor substrate, forming a first mask layer on the conductive film, patterning the first mask layer to form strip-like patterns, forming a second mask layer on the conductive film and the strip-like patterns, carrying out anisotropic etching on the second mask layer so that it is left only on the sidewalls of the strip-like patterns, removing the strip-like patterns, and selectively etching the conductive film using the second mask layer as a mask. This publication also discloses a method of manufacturing a semiconductor device having a plurality of nonvolatile memory cells by applying the selective etching process using the second mask layer as a mask to a pattering process for forming control and floating gate electrodes.

However, with the techniques disclosed in the above publications, there is a problem that variations in performance occur among transistors formed in the semiconductor substrate.

BRIEF SUMMARY OF THE INVENTION

According to a first aspect of the present invention, there is provided a method of manufacturing a semiconductor device, comprising:

forming a gate insulating film on a surface of a semiconductor substrate;

forming a first group of at least one strip-like gate electrode and a second group of strip-like gate electrodes on a surface of the gate insulating film, each strip-like gate electrode having a first face contacting the gate insulating film and longitudinally extending, a second face vertically extending from a long side of the first face and a third face curved and extending between the first and second faces, the at least one gate electrode of the first group and the gate electrodes of the second group being alternately arranged, with the third face of the at least one gate electrode of the first group directed in a first direction and the third face of each gate electrode of the second group directed in a second direction opposite to the first direction, and a gap between the third face of the gate electrode of the first group and the third face of the adjacent gate electrode of the second group being narrower, at the surface of the gate insulating film, than a gap between the second face of the gate electrode of the first group and the second face of the adjacent gate electrode of the second group; and introducing dopant atoms into the surface of the semiconductor substrate through the gaps between the gate electrodes, thereby forming diffusion layers in the semiconductor substrate.

According to a second aspect of the present invention, there is provided a method of manufacturing a semiconductor device comprising:

forming a gate insulating film over the entire surface of a semiconductor substrate;

forming a gate electrode conductive film over the surface of the gate insulating film;

forming a first group of at least one strip-like hard mask and a second group of strip-like hard masks on a surface of the gate electrode conductive film, each strip-like hard mask having a first face contacting the gate electrode conductive film and longitudinally extending, a second face vertically extending from a long side of the first face and a third face curved and extending between the first and second faces, the at least one hard mask of the first group and the hard masks of the second group being alternately arranged, with the third face of the at least one hard mask of the first group directed in a first direction and the third face of each hard mask of the second group directed in a second direction opposite to the first direction, and a gap between the third face of the hard mask of the first group and the third face of the adjacent hard mask of the second group being narrower, at the surface of the gate electrode conductive film, than a gap between the second face of the hard mask of the first group and the second face of the adjacent hard mask of the second group;

selectively etching the gate electrode conductive film using the hard masks as a mask to form gate electrodes; and introducing dopant atoms into the surface of the semiconductor substrate through gaps between stacked hard mask/gate electrode structures, thereby forming diffusion layers in the semiconductor substrate.

According to a third aspect of the present invention, there is provided a method of manufacturing a semiconductor device comprising:

forming an insulating film on a surface of a semiconductor substrate;

forming a first group of at least one strip-like hard mask and a second group of strip-like hard masks on the surface of the insulating film, each strip-like hard mask having a first face contacting the insulating film and longitudinally extending, a second face vertically extending from a long side of the first face and a third face curved and extending between the first and second faces, the at least one hard mask of the first group and the hard masks of the second group being alternately arranged, with the third face of the at least one hard mask of the first group directed in a first direction and the third face of each hard mask of the second group directed in a second direction opposite to the first direction, and a gap between the third face of the hard mask of the first group and the third face of the adjacent hard mask of the second group being narrower, at the surface of the insulating film, than a gap between the second face of the hard mask of the first group and the second face of the adjacent hard mask of the second group;

carrying out selective anisotropic etching on the insulating film and the semiconductor substrate using the hard masks as a mask to form isolation trenches in the semiconductor substrate; and filling the isolation trenches with an insulating material to form isolation regions in the semiconductor substrate.

According to a fourth aspect of the present invention, there is provided a method of manufacturing a semiconductor device comprising:

depositing a tunnel insulating film and a floating gate conductive film in this sequence over the entire surface of a semiconductor substrate;

forming a first group of at least one strip-like one hard mask and a second group of strip-like hard masks on the surface of the floating gate conductive film, each strip-like hard mask having a first face contacting the floating gate conductive film and longitudinally extending, a second face vertically extending from a long side of the first face and a third face curved and extending between the first and second faces, the at least one hard mask of the first group and the hard masks of the second group being alternately arranged, with the third face of the at least one hard mask of the first group directed in a first direction and the third face of each hard mask of the second group directed in a second direction opposite to the first direction, and a gap between the third face of the hard mask of the first group and the third face of the adjacent hard mask of the second group being narrower, at the surface of the floating gate conductive film, than a gap between the second face of the hard mask of the first group and the second face of the adjacent hard mask of the second group;

carrying out selective anisotropic etching on the floating gate electrode conductive film, the tunnel insulating film, and the semiconductor substrate using the hard masks as a mask to form strip-like isolation trenches in the semiconductor substrate and to form tunnel insulating strips and floating gate electrode conductive strips;

filling the isolation trenches, spaces between the tunnel insulating stripes and spaces between the floating gate electrode conductive stripes with an insulating material to form isolation regions in the semiconductor substrate after or upon removing the hard masks;

depositing an interelectrode insulating film and a control gate electrode conductive film in this sequence on the surface of the floating gate electrode conductive strips including isolation regions;

forming a first group of at least one strip-like hard mask and a second group of strip-like hard masks on the surface of the control gate electrode conductive film, each strip-like hard mask having a first face contacting the control gate electrode conductive film and longitudinally extending, a second face vertically extending from a long side of the first face and a third face curved and extending between the first and second faces, the at least one hard mask of the first group and the hard masks of the second group being alternately arranged, with the third face of the at least one hard mask of the first group directed in a first direction orthogonal to a longitudinal direction of the strip-like isolation regions and the third face of each hard mask of the second group directed in a second direction opposite to the first direction, and a gap between the third face of the hard mask of the first group and the third face of the adjacent hard mask of the second group being narrower, at the surface of the control gate electrode conductive film, than a gap between the second face of the hard mask of the first group and the second face of the adjacent hard mask of the second group;

selectively etching the control gate electrode conductive film, the interelectrode insulating film, and the floating gate electrode conductive strips using the hard masks as a mask to form stacked gate structures each comprising a floating gate electrode, the interelectrode insulating film and strip-like control gate electrodes on the tunnel insulating strips including spaces located between them and filled with insulating material; and introducing dopant atoms into the surface of the semiconductor substrate through gaps between the hard masks on the stacked gate structures to form diffusion layers in the semiconductor substrate.

BRIEF DESCRIPTION OF THE SEVERAL VIEWS OF THE DRAWING

FIG. 12 is a perspective view of FIG. 11A;

FIG. 13 is a sectional view for use in explanation of problems when gaps between hard masks are equal each other, and then the semiconductor substrate is selectively etched using the hard masks as a mask to form isolation trenches;

FIGS. 14A1, 14A2, 14A3, 14A4 and 14A5 are plan views illustrating the steps of manufacturing a NAND type nonvolatile memory cell array in accordance with example 4 of the present invention;

FIGS. 15B1 and 15C1 are sectional views taken along lines B-B and C-C, respectively, of FIG. 14A1;

FIGS. 15B2 and 15C2 are sectional views taken along lines B-B and C-C, respectively, of FIG. 14A2;

FIGS. 15B3 and 15C3 are sectional views taken along lines B-B and C-C, respectively, of FIG. 14A3;

FIGS. 15B4 and 15C4 are sectional views taken along lines B-B and C-C, respectively, of FIG. 14A4;

FIGS. 15B5 and 15C5 are sectional views taken along lines B-B and C-C, respectively, of FIG. 14A5;

FIG. 17 is perspective views of the gate electrodes or the hard masks taken in an embodiment.

DETAILED DESCRIPTION OF THE INVENTION

Figure 1A:
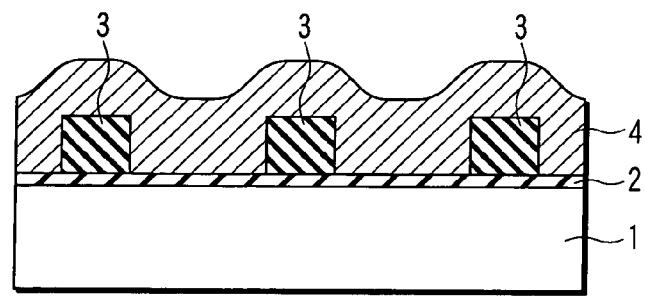
FIGS. 1A, 1B, 1C and 1D are sectional views illustrating the steps of manufacture of a semiconductor device in accordance with example 1 of the present invention.

The semiconductor manufacturing methods according to the embodiments of the present invention will be described in detail below.

First Embodiment

First, after the formation of a gate insulating film over the entire surface of a semiconductor substrate, a first group of at least one strip-like gate electrode and a second group of gate electrodes are formed on the surface of the gate insulating film. Each strip-like gate electrode has a first face contacting the gate insulating film and longitudinally extending, a second face vertically extending from a long side of the first face, a third face curved and extending between the first and second faces, fourth face vertically extending from a short side of the first face to the second and third faces, and fifth face vertically extending from a short side of the first face to the second and third faces in the opposite side of the fourth face. The at least one gate electrode of the first group and the gate electrodes of the second group are alternately arranged, with the third face of the at least one gate electrode of the first group directed in a first direction and the third face of each gate electrode of the second group directed in a second direction opposite to the first direction. A gap between the third face of the gate electrode of the first group and the third face of the adjacent gate electrode of the second group being narrower, at the surface of the gate insulating film, than a gap between the second face of the gate electrode of the first group and the second face of the adjacent gate electrode of the second group.

The gate insulating film may be, for example, silicon oxide, silicon oxy-nitride, or the like.

The at least one gate electrode of the strip-like first group and the strip-like gate electrodes of the second group are formed in the following manner by way of example. That is, strip-like patterns each having steep sidewalls are formed on the gate insulating film. A conductive film for gate electrodes is deposited onto the entire surface of the gate insulating film including the patterns. Then, the gate electrode conductive film is subjected to anisotropic etching (e.g., reactive ion etching [RIE]) so that it is left on the sidewalls of the strip-like patterns. Subsequently, the strip-like patterns are removed to form a first group of at least one strip-like gate electrode and a second group of strip-like gate electrodes on the surface of the gate insulating film described above. Especially, in the first group of the at least one strip-like gate electrode and the second group of the gate electrodes, a gap between the third face of the gate electrode of the first group and the third face of the adjacent gate electrode of the second group is narrower, at the surface of the gate insulating film, than a gap between the second face of the gate electrode of the first group and the second face of the adjacent gate electrode of the second group.

Such gaps between adjacent gate electrodes can be controlled by adjusting the width, the thickness and the spacing of the strip-like patterns. It is also possible by adjusting the width of the gate electrode conductive film which is left on the sidewalls of the strip-like patterns. The above process allows gate electrodes of dimensions below the limits of lithographic techniques to be formed. Specifically, in the gate electrode, it is preferable that a length of the first face between one side of the first face intersected with the second face and other side of the first face intersected with the third face is 10 to 50 nm.

In the formation of gate electrodes, it is desirable for the etching processes to have a high etch selectivity between the strip-like patterns and the gate electrode conductive film. Furthermore, it is desirable for the etching processes that the strip-like patterns and the gate electrode conductive film have a high etch selectivity to the underlying gate insulating film. For example, when the gate insulating film is made of silicon oxide, the strip-like patterns and the gate electrode conductive film are made of silicon nitride and polycrystalline silicon doped with impurities such as phosphorous, respectively. The gate electrode conductive film can be made of not only polycrystalline silicon but also a refractory metal such as molybdenum, a refractory silicide such as platinum silicide, etc.

Next, dopant atoms are introduced into the surface of the semiconductor substrate through gaps between gate electrodes and the gate insulating film to form diffusion layers in the semiconductor substrate, thereby manufacturing a semiconductor device in which transistors are arranged in series.

The dopant may be an n-type impurity such as phosphorous or arsenic, or a p-type impurity such as boron.

Thus, according to the manufacturing method according to the first embodiment, a first group of at least one strip-like gate electrode and a second group of strip-like gate electrodes are formed on a surface of the gate insulating film described above. Especially, each strip-like gate electrode has first to third faces which are coupled to each other under a specific condition. In addition, a gap between the third face of the gate electrode of the first group and the third face of the adjacent gate electrode of the second group is narrower, at the surface of the gate insulating film, than a gap between the second face of the gate electrode of the first group and the second face of the adjacent gate electrode of the second group. Then, dopant atoms are introduced (for example, ion implanted) into the semiconductor substrate using the gate electrodes as a mask. Thereby, diffusion layers can be formed in portions of the semiconductor substrate each of which is located below the gap between two adjacent gate electrodes so that the surface concentration of dopant atoms and the junction depth are each substantially the same for all the diffusion layers. As a result, there is provided a method of manufacturing a semiconductor device which is adapted to ensure the on current of transistors and avoid the short-channel effect.

Second Embodiment

First, a gate insulating film and a gate electrode conductive film are formed in this sequence over the entire surface of a semiconductor substrate. Then, a first group of at least one strip-like hard mask and a second group of strip-like hard masks are formed on a surface of the gate electrode conductive film. Each strip-like hard mask has a first face contacting the gate electrode conductive film, a second face vertically extending from a long side of the first face and a third face curved and extending between the first and second faces, fourth face vertically extending from a short side of the first face to the second and third faces, and fifth face vertically extending from a short side of the first face to the second and third faces in the opposite side of the fourth face. The at least one hard mask of the first group and the hard masks of the second group are alternately arranged, with the third face of the at least one hard mask of the first group directed in a first direction and the third face of each hard mask of the second group directed in a second direction opposite to the first direction. A gap between the third face of the hard mask of the first group and the third face of the adjacent hard mask of the second group is narrower, at the surface of the gate electrode conductive film, than a gap between the second face of the hard mask of the first group and the second face of the adjacent hard mask of the second group.

The gate electrode conductive film may be made of polycrystalline silicon doped with impurities of, say, phosphorous, a refractory metal such as molybdenum, or a refractory silicide such as platinum silicide.

The at least one strip-like hard mask of first group and the strip-like hard masks of the second group are formed, for example, in the following process. That is, strip-like patterns each having steep sidewalls are formed on the gate electrode conductive film. A film of a material for the hard masks is deposited over the entire surface of the gate electrode conductive film including the strip-like patterns. Then, an anisotropic etching (e.g., reactive ion etching) step is carried out on the hard mask material film so that it is left on the sidewalls of the strip-like patterns. Subsequently, the strip-like patterns are removed, thereby forming a first group of at least one strip-like hard mask and a second group of strip-like hard masks on the surface of the gate electrode conductive film described above. Especially, in the first group of the at least one the strip-like hard mask and the second group of the hard masks, a gap between the third face of the hard mask of the first group and the third face of the adjacent hard mask of the second group is narrower, at the surface of the gate electrode conductive film, than a gap between the second face of the hard mask of the first group and the second face of the adjacent hard mask of the second group.

Such gaps between adjacent hard masks can be controlled by adjusting the width, the spacing and the thickness of the strip-like patterns. It is also possible to control the gaps of adjacent hard masks by adjusting the width of remaining hard mask material on the sidewalls of the patterns.

The above process allows hard masks of dimensions below the limits of lithographic techniques to be formed. Specifically, in the hard mask, it is preferable that a length of the first face between one side of the first face intersected with the second face and other side of the first face intersected with the third face is 10 to 50 nm.

In forming the hard masks, it is desirable for the etching processes to have a high etch selectivity between the strip-like patterns and the hard mask material film. Furthermore, it is desirable for the etching processes that the strip-like patterns and the hard mask material film have a high etch selectivity to the underlying gate electrode conductive film. For example, when the gate electrode conductive film is made of polycrystalline silicon doped with impurity such as phosphorous, the strip-like patterns and the hard mask material film can be made of silicon nitride and silicon oxide, respectively.

Next, the gate electrode conductive film is selectively etched using the hard masks as a mask to form gate electrodes. Then, dopant atoms are introduced into the surface of the semiconductor substrate through gaps between stacked hard mask/gate electrode structures and the gate insulating film to form diffusion layers in the substrate, thereby manufacturing a semiconductor device in which a plurality of transistors are arranged in series.

Examples of the dopant are an n-type impurity such as phosphorous or arsenic, or a p-type impurity such as boron.

As described above, according to the second embodiment, a first group of at least one strip-like hard mask and a second group of strip-like hard masks are formed on a surface of the gate electrode conductive film. Especially, each strip-like hard mask has first to third faces which are coupled each other under a specific condition. In addition, a gap between the third face of the hard mask of the first group and the third face of the adjacent hard mask of the second group is narrower, at the surface of the gate electrode conductive film, than a gap between the second face of the hard mask of the first group and the second face of the adjacent hard mask of the second group. Then, using the hard masks as a mask, the gate electrode conductive film is selectively etched to form gate electrodes. Furthermore, dopant atoms are introduced (e.g., ion implanted) into the surface of the semiconductor substrate through gaps between stacked hard mask/gate electrode structures. Thereby, diffusion layers can be formed in portions of the semiconductor substrate which correspond to the gaps between stacked hard mask/gate electrode structures so that they are substantially uniform in the surface concentration of dopant atoms and the junction depth. As a result, a semiconductor device can be manufactured which is adapted to ensure the on current of transistors and avoid the short-channel effect.

Third Embodiment

First, an insulating film, for example made of silicon oxide, is formed on a semiconductor substrate. Then, a first group of at least one strip-like hard mask and a second group of strip-like hard masks are formed on a surface of the insulating film. Each strip-like hard mask has a first face contacting the insulating film, a second face vertically extending from a long side of the first face and a third face curved and extending between the first and second faces, fourth face vertically extending from a short side of the first face to the second and third faces, and fifth face vertically extending from a short side of the first face to the second and third faces in the opposite side of the fourth face. The at least one hard mask of the first group and the hard masks of the second group are alternately arranged, with the third face of the at least one hard mask of the first group directed in a first direction and the third face of each hard mask of the second group directed in a second direction opposite to the first direction. A gap between the third face of the hard mask of the first group and the third face of the adjacent hard mask of the second group is narrower, at the surface of the insulating film, than a gap between the second face of the hard mask of the first group and the second face of the adjacent hard mask of the second group.

The at least one hard mask of first group and the hard masks of the second group can be formed in the same process with the second embodiment using strip-like patterns and a hard mask material film. This process allows hard masks of dimensions below the limits of lithographic techniques to be formed. Specifically, in the hard mask, it is preferable that a length of the first face between one side of the first face intersected with the second face and other side of the first face intersected with the third face is 10 to 50 nm.

In forming the hard masks, it is desirable for the etching processes to have a high etch selectivity between the strip-like patterns and the hard mask material film. Furthermore, it is desirable for the etching processes that the strip-like patterns and the hard mask material film have a high etch selectivity to the underlying insulating film. For example, when the insulating film is made of silicon oxide, the hard masks and the strip-like patterns can be made of silicon nitride and polycrystalline silicon, respectively.

Next, using the hard masks as a mask, selective anisotropic etching (e.g., reactive ion etching) is carried out on the insulating film and the semiconductor substrate to form isolation trenches in the semiconductor substrate. The isolation trenches are filled with an insulating material to form isolation regions. A semiconductor device is then manufactured in which a plurality of transistors are arranged in parallel.

The process of filling the isolation trenches with insulating material involves removing the hard masks, depositing a isolation insulating film over the entire surface of the insulating film including the trenches so as to fill up the trenches and then etching back the isolation insulating film by means of chemical mechanical polishing (CMP). Another process of filling the isolation trenches with insulating material involves depositing a isolation insulating film over the entire surface of the hard masks including the trenches so as to fill up the trenches and then etching back the isolation insulating film and the hard masks by means of chemical mechanical polishing (CMP).

An example of the isolation insulating film is silicon oxide.

Thus, according to the third embodiment, a first group of at least one strip-like hard mask and a second group of strip-like hard masks are formed on the surface of the insulating film described above. Especially, each strip-like hard mask has first to third faces which are coupled each other under a specific condition. In addition, a gap between the third face of the hard mask of the first group and the third face of the adjacent hard mask of the second group is narrower, at the surface of the insulating film, than a gap between the second face of the hard mask of the first group and the second face of the adjacent hard mask of the second group. Then, using the strip-like hard masks as a mask, selective reactive ion etching is carried out on the insulating film and the semiconductor substrate. Thereby, isolation trenches of equal depth can be formed in the semiconductor substrate. As a result, isolation regions of equal depth can be formed by filling the isolation trenches with insulating material. Therefore, a semiconductor device can be manufactured which is adapted to ensure a device isolation withstand voltage and avoid device isolation trench filling failures.

Fourth Embodiment

First, a tunnel insulating film and a floating gate electrode conductive film are deposited in this sequence over the entire surface of a semiconductor substrate. Then, a first group of at least one strip-like hard mask and a second group of strip-like hard masks are formed on the surface of the floating gate conductive film. Each strip-like hard mask has a first face contacting the floating gate conductive film, a second face vertically extending from a long side of the first face and a third face curved and extending between the first and second faces, fourth face vertically extending from a short side of the first face to the second and third faces, and fifth face vertically extending from a short side of the first face to the second and third faces in the opposite side of the fourth face. The at least one hard mask of the first group and the hard masks of the second group are alternately arranged, with the third face of the at least one hard mask of the first group directed in a first direction and the third face of each hard mask of the second group directed in a second direction opposite to the first direction. A gap between the third face of the hard mask of the first group and the third face of the adjacent hard mask of the second group is narrower, at the surface of the floating gate conductive film, than a gap between the second face of the hard mask of the first group and the second face of the adjacent hard mask of the second group.

The floating gate electrode conductive film may be made of polycrystalline silicon doped with an impurity of, for example phosphorous.

The at least one strip-like hard mask of first group and the strip-like hard masks of the second group can be formed in the same process with the second embodiment using strip-like patterns and a hard mask material film. This process allows hard masks of dimensions below the limits of lithographic techniques to be formed. Specifically, in the hard mask, it is preferable that a length of the first face between one side of the first face intersected with the second face and other side of the first face intersected with the third face is 10 to 50 nm.

In forming the hard masks, it is desirable for the etching processes to have a high etch selectivity between the strip-like patterns and the hard mask material film. Furthermore, it is desirable for the etching processes that the strip-like patterns and the hard mask material film have a high etch selectivity to the underlying floating gate electrode conductive film. For example, when the floating gate conductive film is made of polycrystalline silicon doped with impurities of such as phosphorous, the strip-like patterns and the hard masks can be made of silicon nitride and silicon oxide, respectively.

Next, using the hard masks as a mask, selective anisotropic etching (e.g., reactive ion etching) is carried out on the floating gate conductive film, the tunnel insulating film, and the semiconductor substrate to form isolation trenches in the substrate. At the same time, patterned floating gate electrode conductive strips and patterned tunnel insulating strips are formed by selectively etching the tunnel insulating film and the floating gate electrode conductive film.

Next, the isolation trenches are filled with an insulating material to form strip-like isolation regions. At the same time, spaces between the tunnel insulating strips and spaces between the floating gate electrode conductive strips are filled with the insulating material, respectively.

The process of filling the isolation trenches with insulating material involves, as in the third embodiment, removing the hard masks, depositing a isolation insulating film over the entire surface of the floating gate electrode conductive stripes including the trenches so as to fill up the trenches and then etching back the isolation insulating film by means of chemical mechanical polishing (CMP). Another process of filling the isolation trenches with insulating material involves depositing a isolation insulating film over the entire surface of the hard masks including the trenches so as to fill up the trenches and then etching back the isolation insulating film and the hard masks by means of chemical mechanical polishing (CMP).

An example of the isolation insulating film is silicon oxide.

Next, an interelectrode insulating film and a control electrode conductive film are deposited in this sequence on the surface of the floating gate electrode conductive strips and the spaces filled with the insulating material.

The interelectrode insulating film may be made of, for example a composite of oxide silicon and silicon nitride. The control electrode conductive film may be made of, for example polycrystalline silicon doped with impurities such as phosphorous.

Next, a first group of at least one strip-like hard mask and a second group of strip-like hard masks are formed on the surface of the control gate electrode conductive film. Each strip-like hard mask has a first face contacting the control gate electrode conductive film, a second face vertically extending from a long side of the first face and a third face curved and extending between the first and second faces, fourth face vertically extending from a short side of the first face to the second and third faces, and fifth face vertically extending from a short side of the first face to the second and third faces in the opposite side of the fourth face. The at least one hard mask of the first group and the hard masks of the second group are alternately arranged, with the third face of the at least one hard mask of the first group directed in a first direction orthogonal to a longitudinal direction of each floating gate electrode conductive strip and the third face of each hard mask of the second group directed in a second direction opposite to the first direction. A gap between the third face of the hard mask of the first group and the third face of the adjacent hard mask of the second group is narrower, at the surface of the control gate electrode conductive film, than a gap between the second face of the hard mask of the first group and the second face of the adjacent hard mask of the second group.

Then, using the hard masks as a mask, selective etching is carried out on the control gate electrode conductive film, the interelectrode insulating film and the floating gate conductive strips to form stacked gate structures each comprising a floating gate electrode, the interelectrode insulating film and a strip-like control gate electrode on the surface of the tunnel insulating film and the spaces filled with the insulating material. The strip-like control gate electrode extends in a direction perpendicular to the strip-like isolation regions. It is desirable that the selective etching be anisotropic etching such as reactive ion etching.

The strip-like hard masks can be formed in the same process with the second embodiment using strip-like patterns and a hard mask material film. This process allows hard masks of dimensions below the limits of lithographic techniques to be formed. Specifically, in the hard mask, it is preferable that a length of the first face between one side of the first face intersected with the second face and other side of the first face intersected with the third face is 10 to 50 nm.

In forming the hard masks, it is desirable for the etching processes to have a high etch selectivity between the strip-like patterns and the hard mask material film. Furthermore, it is desirable for the etching processes that the strip-like patterns and the hard mask material film have a high etch selectivity to the underlying the control gate conductive film. For example, when the control gate conductive film is made of polycrystalline silicon doped with impurities such as phosphorous, the strip-like patterns and the hard mask material film can be made of silicon nitride and silicon oxide, respectively.

Next, dopant atoms are introduced into the surface of the semiconductor substrate through the gaps between adjacent stacked floating gate electrode/interelectrode insulating film/strip-like control gate electrode/strip-like hard mask structures to form diffusion layers in the semiconductor substrate. Thus, a semiconductor device in which nonvolatile memories are arranged in the form of a matrix is manufactured.

Examples of the dopant are an n-type impurity such as phosphorous or arsenic, or a p-type impurity such as boron.

Thus, described above, according to the fourth embodiment, a first group of at least one strip-like hard mask and a second group of strip-like hard masks are formed on the surface of a floating gate conductive film which deposited on a tunnel insulating film on a semiconductor substrate described above. Especially, each strip-like hard mask has first to third faces which are coupled each other under a specific condition. In addition, a gap between the third face of the hard mask of the first group and the third face of the adjacent hard mask of the second group is narrower, at the surface of the insulating film, than a gap between the second face of the hard mask of the first group and the second face of the adjacent hard mask of the second group. Then, using the strip-like hard masks as a mask, selective anisotropic etching is carried out on the floating gate electrode conductive film, the tunnel insulating film and the semiconductor substrate, thereby forming isolation trenches of equal depth in the semiconductor substrate. At the same time, the tunnel insulating film and the floating gate electrode conductive film can be patterned into strips. As a result, isolation regions of equal depth can be formed by filling the isolation trenches with insulating material after the hard masks are removed. Therefore, it becomes possible to ensure a isolation withstand voltage and avoid device isolation trench filling failures.

In addition, after an interelectrode insulating film and a control electrode conductive film are deposited in this sequence on the surface of the floating gate electrode conductive strips including spaces between them, which are filled with an insulating material, a first group of at least one strip-like hard mask and a second group of strip-like hard masks are formed on the surface of the control gate electrode conductive film described above. Especially, each strip-like hard mask has first to third faces which are coupled each other under a specific condition. Further, a gap between the third face of the hard mask of the first group and the third face of the adjacent hard mask of the second group is narrower, at the surface of the insulating film, than a gap between the second face of the hard mask of the first group and the second face of the adjacent hard mask of the second group. Then, using the hard masks as a mask, selective anisotropic etching is carried out on the control gate electrode conductive film, the interelectrode insulating film and the floating gate conductive film to form, on top of tunnel insulating strips including the spaces filled with the insulating material, strip-like stacked gate structures each comprised of a floating gate electrode, the interelectrode insulating film and strip-like control gate electrodes and extending in a direction perpendicular to the strip-like isolation regions. Furthermore, dopant atoms are introduced (e.g., ion implanted) into the surface of the semiconductor substrate through the gaps between adjacent stacked floating gate electrode/interelectrode insulating film/control gate electrode/hard mask structures to form diffusion layers. Thereby, diffusion layers can be formed in portions of the semiconductor substrate which correspond to the gaps between adjacent stacked structures, which are substantially equal to one another in the surface concentration of dopant atoms and the junction depth. As a result, it becomes possible to ensure the on current of nonvolatile memory cells and avoid the short-channel effect.

The examples of the present invention will be described below with reference to the accompanying drawings.

EXAMPLE 1

First, as shown in FIG. 1A, a semiconductor substrate 1 consisting of p-type monocrystalline silicon was formed on top with a gate insulating film 2 made of silicon oxy-nitride. Then, using standard lithographic techniques, the gate insulating film 2 was formed on top with a repeated structure of strip-like patterns 3 consisting of, say, silicon nitride. The strip-like patterns were set to 40 nm in thickness, 60 nm in width, and 120 nm in spacing. Next, a conductive film 4 for gate electrodes, consisting of phosphorus-doped polycrystalline silicon, was deposited over the entire surface of the gate insulating film 2 including the strip-like patterns 3 by means of, for example, CVD.

Figure 1B:
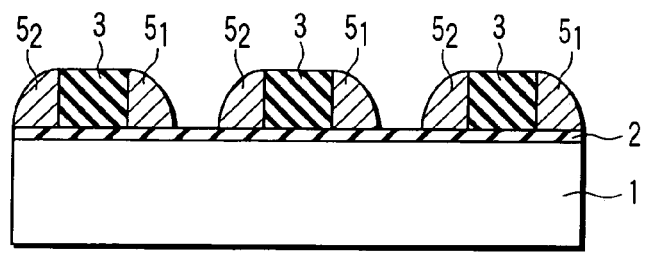
Figure 1C:
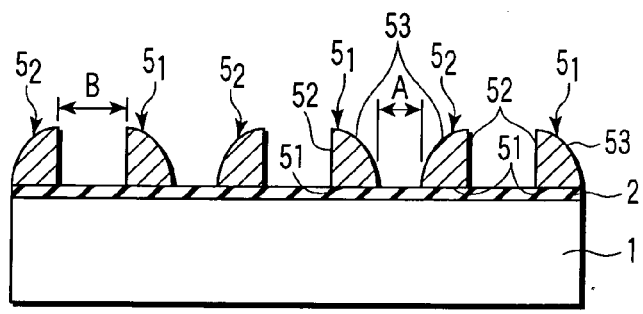
Figure 2:
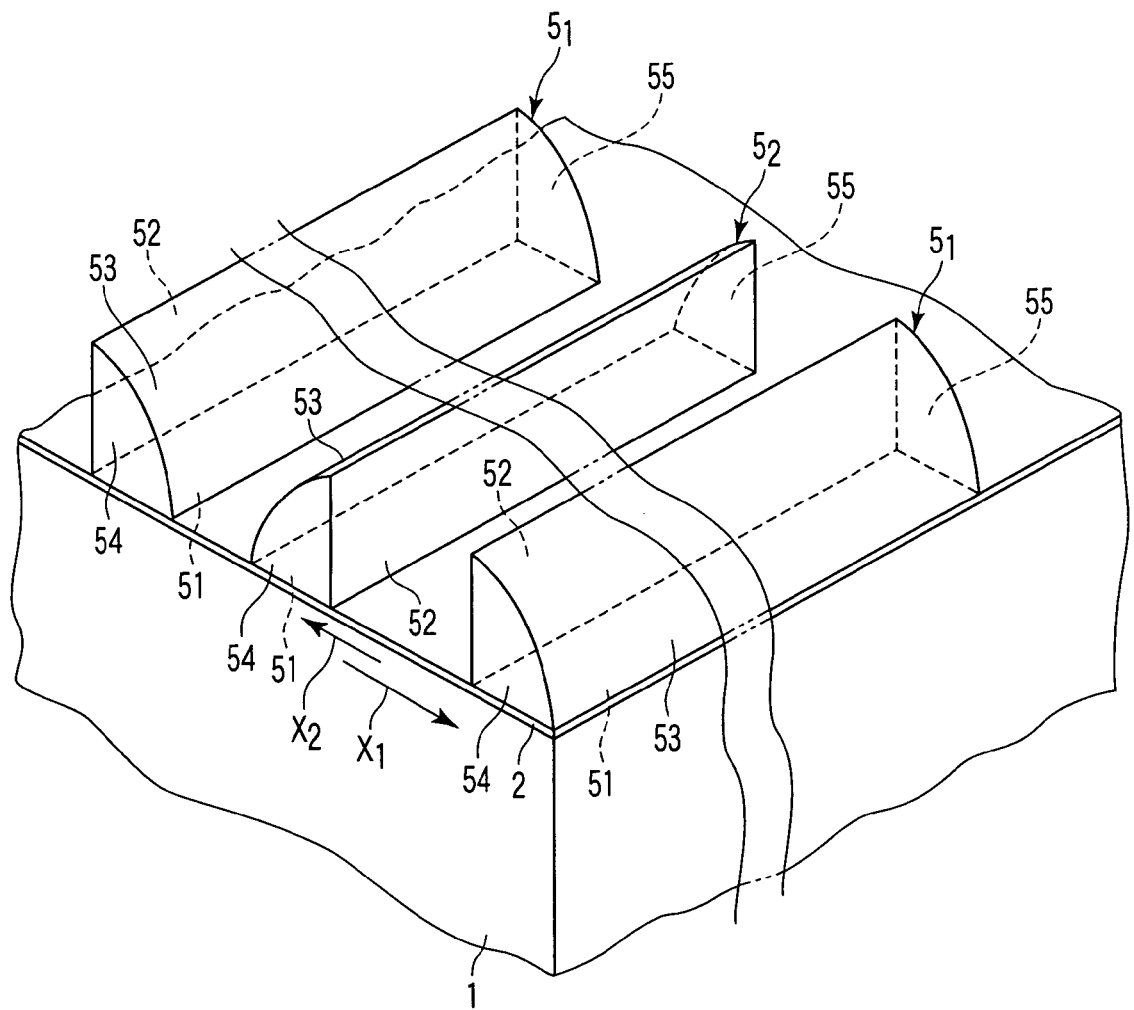
FIG. 2 is a perspective view of FIG. 1C.

Next, as shown in FIG. 1B, the gate electrode conductive film 4 was subjected to an anisotropic etching process (e.g., reactive ion etching) so that it is left only on the sidewalls of the strip-like patterns 3, thereby forming strip-like electrodes $5_1$ and $5_2$ made of phosphorous-doped polycrystalline silicon, which were narrower than the strip-like patterns 3, on the surface of the gate insulating film 2. After that, as shown in FIG. 1C and FIG. 2, the strip-like patterns 3 were removed by means of hot phosphoric acid etching to form a first group of strip-like gate electrodes $5_1$ and a second group of strip-like gate electrodes $5_2$ on the surface of the gate insulating film 2. As shown in FIG. 2, each strip-like gate electrodes $5_1$ and $5_2$ has a first face 51 contacting the gate insulating film 2 and longitudinally extending, a second face 52 vertically extending from a long side of the first face 51, a third face 53 curved and extending between the first and second faces 51 and 52, fourth face 54 vertically extending from a short side of the first face 51 to the second and third faces 52 and 53, and fifth face 55 vertically extending from a short side of the first face 51 to the second and third faces 52 and 53 in the opposite side of the fourth face 54. The gate electrodes 5$_1$ of the first group and the gate electrodes 5$_2$ of the second group are alternately arranged, with the third face 53 of each gate electrode 5$_1$ of the first group directed in a first direction shown by the arrow X$_1$ and the third face 53 of each gate electrode 5$_2$ of the second group directed in a second direction by the arrow X$_2$ opposite to the first direction shown by the arrow X$_1$. A gap "A" between the third face 53 of the gate electrode 5$_1$ of the first group and the third face 53 of the adjacent gate electrode 5$_2$ of the second group become so narrow as to be about 40 nm at the surface of the gate insulating film 2. A gap "B" between the second face 52 of the gate electrode 5$_1$ of the first group and the second face 52 of the adjacent gate electrode 5$_2$ of the second group became so broad as to be about 60 nm. In the strip-like gate electrodes 5$_1$ and 5$_2$, a length of the first face 51 between one side of the first face 51 intersected with the second face 52 and other side of the first face 51 intersected with the third face 53 is about 40 nm.

Figure 1D:
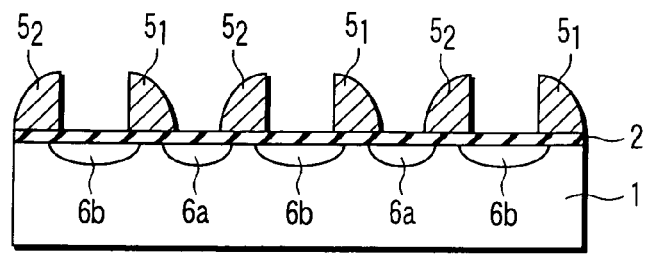

Next, using the strip-like gate electrodes 5$_1$ and 5$_2$ as a mask, dopant atoms (for example, an n-type impurity of phosphorous) were ion implanted into the semiconductor substrate 1 through the gaps "A" and "B" between adjacent gate electrodes 5$_1$ and 5$_2$ to form diffusion layers 6*a* and 6*b*. At this point, as shown in FIG. 1D, repeated variations of the diffusion layers 6*a* and 6*b* in the surface concentration of dopant atoms, the junction depth, and the area of overlap with the gate electrodes 5$_1$ and 5$_2$ can be suppressed.

Figure 3:
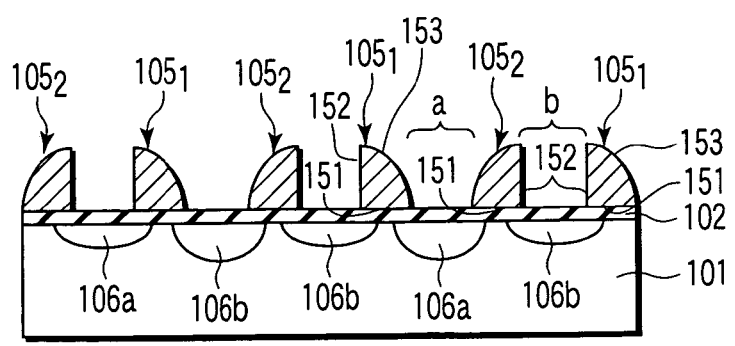
FIG. 3 is a sectional view for use in explanation of problems when gaps between gate electrodes are equal each other, and then diffusion layers are formed in the semiconductor substrate using the gate electrodes as a mask.

That is, as shown in FIG. 3, a first group of strip-like gate electrodes 105$_1$ and a second group of strip-like gate electrodes 105$_2$ were formed on the surface of the gate insulating film 102 on a semiconductor substrate 101. The strip-like gate electrodes 105$_1$ and 105$_2$ have first to third faces 151, 152 and 153 in similar to the strip-like gate electrodes 5$_1$ and 5$_2$ described above. A gap between the third face 153 of the gate electrode 105$_1$ of the first group and the third face 153 of the adjacent gate electrode 105$_2$ of the second group is an equal, at the surface of the gate insulating film 102, to a gap between the second face 152 of the gate electrode 105$_1$ of the first group and the second face 152 of the adjacent gate electrode 105$_2$ of the second group. Using these gate electrodes 105$_1$ and 105$_2$ as a mask, dopant atoms (for example, an n-type impurity of phosphorous) are ion implanted into the semiconductor substrate 101 through the regions "a" and "b" between adjacent gate electrodes 105$_1$ and 105$_2$. In this ion implantation process, the adjacent gate electrodes 105$_1$ and 105$_2$ whose third faces 153 and 153 face each other form a region "a", which is large in a prospective angle, and the adjacent gate electrodes 105$_1$ and 105$_2$ whose second faces 152 and 152 face each other form a region "b", which is small in a prospective angle. For this reason, diffusion layers 106*a* and 106*b* formed in the semiconductor substrate 101 in correspondence with the regions "a" and "b" become different from each other in doping level and shape. With the diffusion layers 106*a* corresponding to the region "a" which is large in the prospective angle, the depth of junction is deep, the area of overlap with the gate electrodes 105$_1$ and 105$_2$ is broad, and the concentration of dopant atoms is high. With the diffusion layers 106*b* corresponding to the region "b" which is small in the prospective angle, on the other hand, the depth of junction is shallow, the area of overlap with the gate electrodes 105$_1$ and 105$_2$ is narrow, and the concentration of dopant atoms is low. As a result, if the amount of dopant atoms introduced into the substrate 101 were reduced in order to avoid the short channel effect, then the resistance of the diffusion layers 106*b* would increase and consequently the on current of transistors would lower. Conversely, if the amount of the dopant atoms were increased in order to increase the on current of transistors, then the junction depth and the area of overlap with the gate electrode of the diffusion layer 106*a* would increase, causing the short-channel effect and increasing the off current of transistors.

Therefore, as in Example 1, by making the gap "A" between adjacent gate electrodes 5$_1$ and 5$_2$ whose the third faces 53 and 53 face each other, which are large in the prospective angle, narrower than the gap "B" between adjacent gate electrodes 5$_2$ and 5$_1$ whose the second faces 52 face each other, which are small in the prospective angle, the amount of dopant introduced into the surface portion of the semiconductor substrate 1 corresponding to the gap "A" can be reduced. For this reason, the diffusion layers 6*a* can be formed shallow in junction depth, narrow in the area of overlap with the gate electrodes 5$_1$ and 5$_2$ and low in dopant concentration. On the other hand, the amount of dopant can be increased in the surface portion of the semiconductor substrate 1 corresponding to the gap "B", allowing diffusion layers 6*b* to be formed deep in junction depth, broad in overlap area, and high dopant concentration. As a result, repeated variations in junction depth and overlap area of the diffusion layers 6*a* and 6*b* can be suppressed, allowing a semiconductor device to be manufactured which is adapted to ensure the on current of transistors and avoid the short-channel effect.

Figure 4:
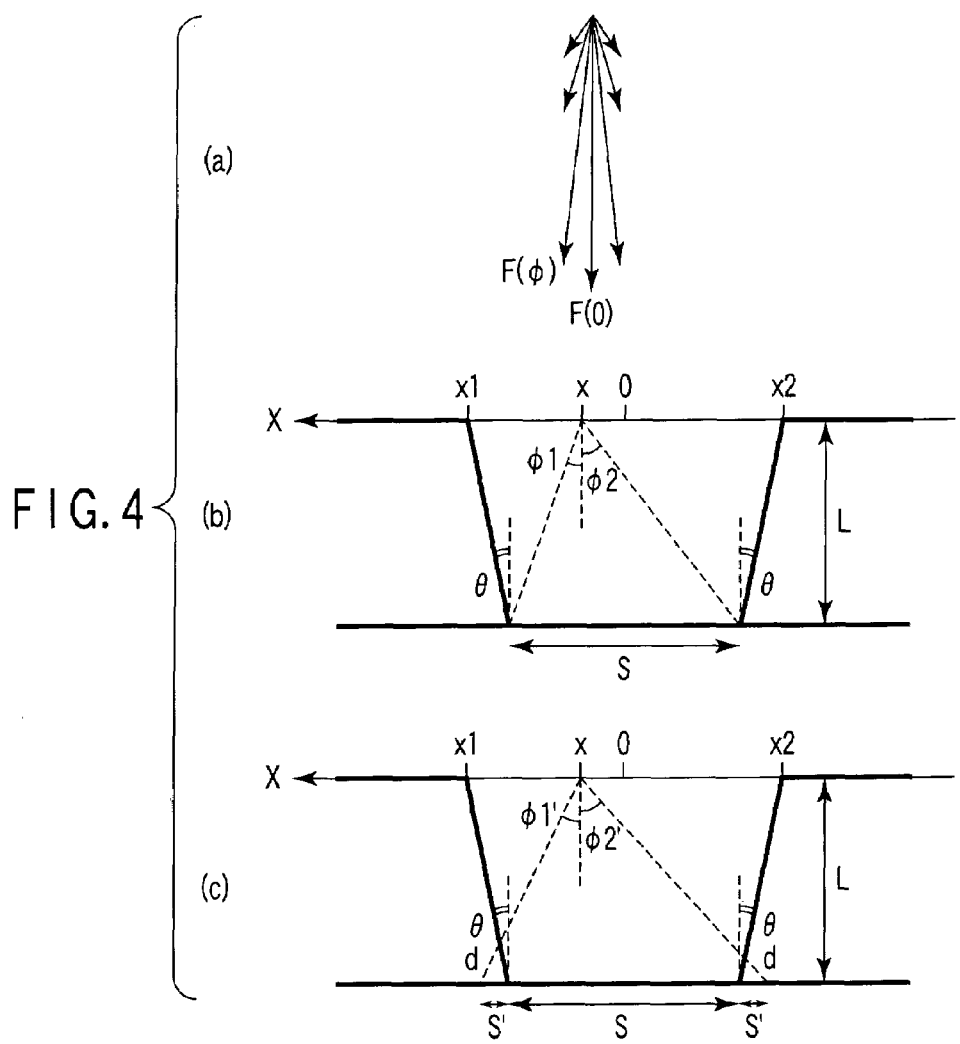
FIG. 4 is schematic diagrams for use in explanation of control of the gap between the gate electrodes in example 1.

The control of the gate electrode gap will be explained with reference to (a), (b) and (c) of FIG. 4. FIG. 4 (*a*) is a schematic representation of a flux distribution of dopant atoms in ion implantation. Even when dopant atoms are emitted in the direction of angle (0), flux components F(φ) in the direction of angle (φ) are present. The total flux F(total) is given by integrating F(φ) with respect to p; that is, F(total) is given by the equation $$F(\text{total}) = \int F(\phi) d\phi \qquad (1)$$

Consider now ion implantation into the surface of a semiconductor substrate through gate electrodes in which the angle of sidewall with respect to the normal to the substrate surface is θ, the thickness is L, and the spacing is S as shown in FIG. 4 (*b*). Here, taking the horizontal axis on the top of the gate electrodes as the x axis, we obtain $x1=(S/2)+L\times\tan\theta$ and $x2=(-S/2)-L\times\tan\theta$ The angles φ1 and φ2 of a prospective angle to the substrate surface at point x on the x axis are represented by φ1=tan$^{-1}$[(S/2−x)/L] and φ2=tan$^{-1}$[(−S/2−x)/L]

For this reason, the total flux F(total) to the substrate surface is obtained by integrating the flux component F(φ, x) in the direction of angle φ at point x from φ2 to φ1 with respect to p and further from x2 to x1 with respect to x; that is, $$F(\text{total}) = \int_{x2}^{x1} \int_{\phi2}^{\phi1} F(\phi, x) d\phi dx \qquad (2)$$

The gap "A" between adjacent gate electrodes whose third faces face each other and the gap "B" between adjacent gate electrodes whose second faces face each other are simply controlled so that F(total) becomes the same for the regions a and b which are different in the aforementioned prospective angle.

If ions to be implanted has sufficient energy to penetrate through gate electrodes into the semiconductor substrate surface, such correction as shown in FIG. 4 (c) will be required. Assuming that the distance that ions penetrate the gate electrode is d, φ1 and φ2 become φ1' and φ2', respectively, which are larger than those in FIG. 4 (b). The distance, d, that the ions penetrate the gate electrodes depends mainly on the energy and mass of ions to be implanted and the density and mass of the gate electrode material. Thus, the total flux F(total) at the surface of the semiconductor substrate surface is given by integrating the flux component F(φ, x) in the direction of angle φ at point x from φ2' to φ1' with respect to φ and further from x2 to x1 with respect to x; that is, $$F(\text{total}) = \int_{x2}^{x1} \int_{\phi2'}^{\phi1'} F(\phi, x) d\phi dx \qquad (3)$$

The gap "A" between adjacent gate electrodes whose the third faces face each other and the gap "B" between adjacent gate electrodes whose second faces face each other are simply controlled so that F(total) becomes the same for the regions "a" and "b" which are different in the aforementioned prospective angle. Equation (3) is also applicable to the case where, as in Example 2 to be described later, gate electrodes are formed using hard masks and dopant atoms are introduced into a substrate using stacked gate electrode/hard mask structures as a mask.

In the above description, a method was illustrated which makes the total flux of dopant atoms uniform. This method is desirable when the amount of diffusion of dopant atoms is large in a subsequent heat treatment step. When the amount of diffusion is small, on the other hand, the length of overlap with the gate electrode, the maximum value of S' shown in FIG. 4 (c), may be made uniform.

EXAMPLE 2

Figure 5A:
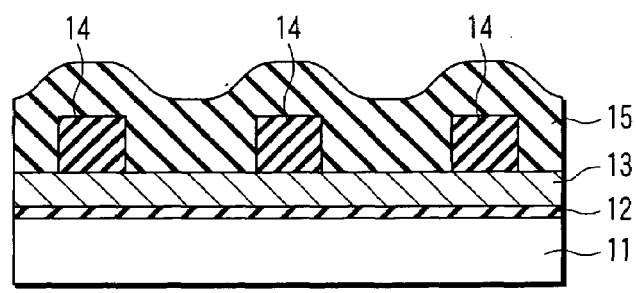
FIGS. 5A, 5B, 5C, 5D and 5E are sectional views illustrating the steps of manufacture of a semiconductor device in accordance with example 2 of the present invention.

First, as shown in FIG. 5A, a semiconductor substrate 11 made of p-type monocrystalline silicon was formed on top with a gate insulating film 12 made of silicon oxy-nitride. A gate electrode conductive film 13 made of phosphorous-doped polycrystalline silicon was deposited over the entire surface. Then, using standard lithographic techniques, a repeated structure of strip-like patterns 14 consisting of silicon nitride was formed on the surface of the conductive film 13. The strip-like patterns 14 were set to 40 nm in thickness, 60 nm in width, and 120 nm in spacing. Next, a silicon oxide film 15 was deposited at a thickness of 60 nm over the entire surface of the gate electrode conductive film 13 including the strip-like patterns 14 by means of, for example, CVD.

Figure 5B:
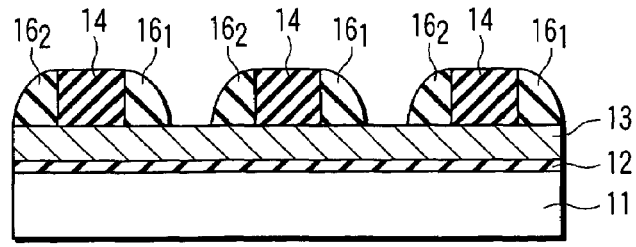
Figure 5C:
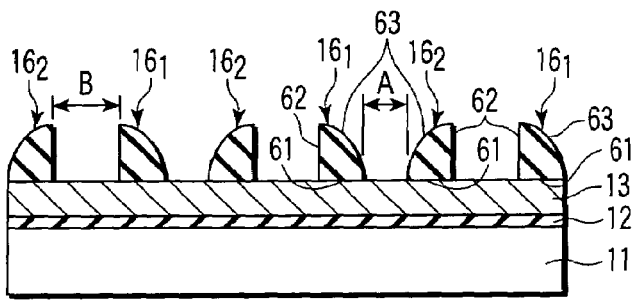
Figure 6:
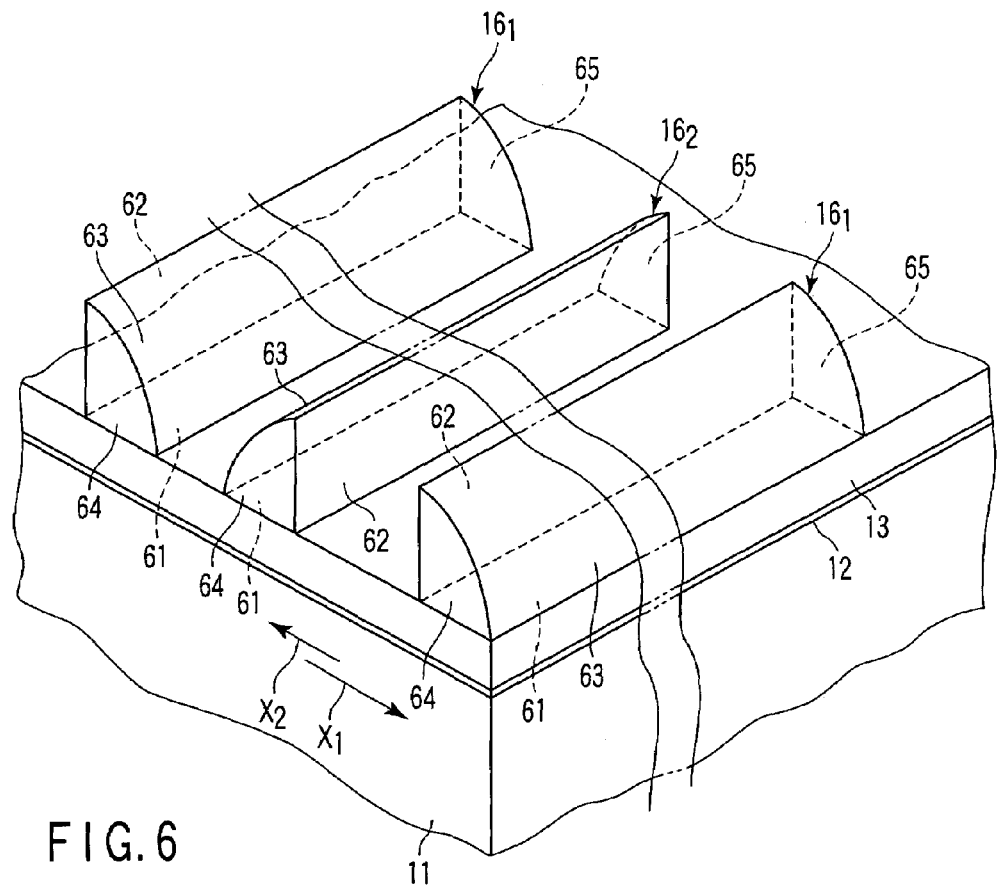
FIG. 6 is a perspective view of FIG. 5C.

Next, as shown in FIG. 5B, the silicon oxide film 15 was subjected to an anisotropic etching process (e.g., reactive ion etching) so that it is left only on the sidewalls of the strip-like patterns 14, thereby forming strip-like hard masks $16_1$ and $16_2$ made of silicon oxide, which were narrower than the strip-like patterns 14, on the surface of the gate electrode conductive film 13. After that, as shown in FIG. 5C and FIG. 6, the strip-like patterns 14 were removed by for example hot phosphoric acid etching to form a first group of strip-like hard masks $16_1$ and a second group of strip-like hard masks $16_2$ on the surface of the gate electrode conductive film 13. As shown in FIG. 6, each strip-like hard masks $16_1$ and $16_2$ has a first face 61 contacting the gate electrode conductive film 13 and longitudinally extending, a second face 62 vertically extending from a long side of the first face 61, a third face 63 curved and extending between the first and second faces 61 and 62, fourth face 64 vertically extending from a short side of the first face 61 to the second and third faces 62 and 63, and fifth face 65 vertically extending from a short side of the first face 61 to the second and third faces 62 and 63 in the opposite side of the fourth face 64. The strip-like hard masks $16_1$ of the first group and the strip-like hard masks $16_2$ of the second group are alternately arranged, with the third face 63 of each hard masks $16_1$ of the first group directed in a first direction shown by the arrow $X_1$ and the third face 63 of each hard masks $16_2$ of the second group directed in a second direction by the arrow $X_2$ opposite to the first direction shown by the arrow $X_1$. A gap "A" between the third face 63 of the hard mask $16_1$ of the first group and the third face 63 of the adjacent hard mask $16_2$ of the second group become so narrow as to be about 40 nm at the surface of the gate electrode conductive film 13. A gap "B" between the second face 62 of the hard mask $16_1$ of the first group and the second face 62 of the adjacent hard mask $16_2$ of the second group became so broad as to be about 60 nm. In the strip-like hard masks $16_1$ and $16_2$, a length of the first face 61 between one side of the first face 61 intersected with the second face 62 and other side of the first face 61 intersected with the third face 63 is about 40 nm.

Figure 5D:
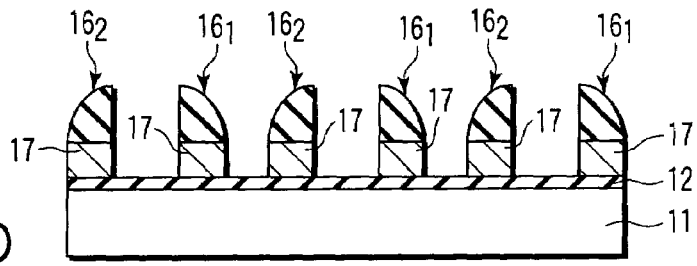
Figure 5E:
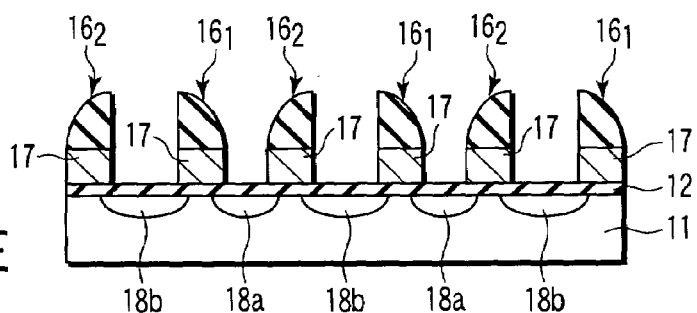

Next, as shown in FIG. 5D, using the hard masks $16_1$ and $16_2$ as a mask, the exposed portions of the gate electrode conductive film 13 were selectively removed by means of anisotropic etching (e.g., reactive ion etching) to form gate electrodes 17. Subsequently, using the hard masks $16_1$ and $16_2$ and the gate electrodes 17 as a mask, dopant atoms (for example, an n-type impurity of phosphorous) were ion implanted into the monocrystalline silicon substrate 11. At this point, by making the gaps "A" between adjacent hard masks $16_1$ and $16_2$ whose the third faces face each other, which are large in the a prospective angle, narrower than the gaps "B" between the adjacent hard masks $16_2$ and $16_1$ whose the second faces face each other, which are small in a prospective angle, diffusion layers 18a and 18b can be formed which are substantially uniform in the surface concentration of dopant atoms, the junction depth, and the area of overlap with the gate electrode 17 as shown in FIG. 5E. A semiconductor device can be manufactured which is adapted to ensure the on current of transistors and avoid the short-channel effect.

Figure 7:
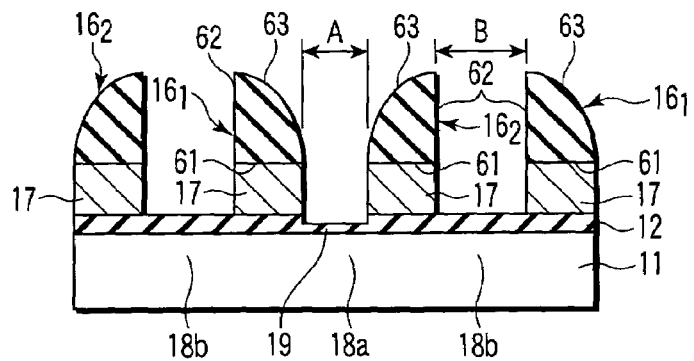
FIG. 7 is a sectional view illustrating a modification of example 2.

In the above Example 2, the diffusion layers 18a and 18b which are substantially uniform in the surface concentration of dopant atoms, the junction depth, and the area of overlap with the gate electrode 17 can also be formed in the following manners:

(1) As shown in FIG. 7, in selectively removing the exposed portions of the gate electrode conductive film 13 through reactive ion etching using the hard masks $16_1$ and $16_2$ as a mask to form the gate electrodes 17, even if the gate insulating film 12 exposed between the gate electrodes 17 is also etched to form thin insulating film portions 19, such diffusion layers 18a and 18b as described above can be formed.

Figure 8:
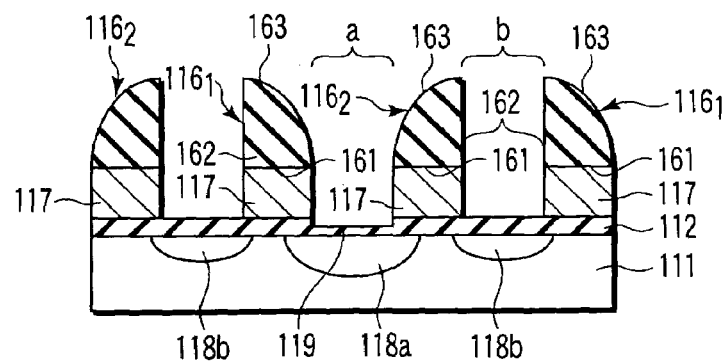
FIG. 8 is a sectional view for use in explanation of problems when gaps between hard masks are equal each other, and then the gate electrode conductive film is selectively etched using the hard masks as a mask and diffusion layers are formed in the semiconductor substrate.

That is, as shown in FIG. 8, a first group of strip-like hard masks $116_1$ and a second group of strip-like hard masks $116_2$ on the surface of a gate electrode conductive film on a semiconductor substrate 111 of, say, p-type monocrystalline silicon. The strip-like hard masks $116_1$ and $116_2$ have first to third faces 161, 162 and 163 in similar to the strip-like hard masks 16$_1$ and 16$_2$ described above. A gap between the third face 163 of the hard masks 116$_1$ of the first group and the third face 163 of the adjacent hard masks 116$_2$ of the second group is an equal, at the surface of the gate electrode conductive film, to a gap between the second face 152 of the hard masks 116$_2$ of the first group and the second face 152 of the adjacent hard masks 116$_1$ of the second group. In selectively removing the exposed portions of the gate electrode conductive film through reactive ion etching using the hard masks 116$_1$ and 116$_2$ as a mask, the exposed gate insulating film 112 between the gate electrodes 117 can also be etched to form thin insulating film portions 119. This is, regions "a" of adjacent hard masks 116$_1$ and 116$_2$ whose the curved third faces face each other are large in the a prospective angle. On the other hand, regions "b" of adjacent hard masks 116$_1$ and 116$_2$ whose the second faces vertically extending face each other are a smaller than the regions "a" in the a prospective angle. Therefore, the regions "a" are irradiated with more reactive ions and the surface of the gate insulating film 112 in those regions is exceedingly subject to etching. As a result, the amount of dopant introduced into the semiconductor substrate surface is larger in the region "a" than in the region "b" where the prospective angle is small and the insulating film is thick, thus forming two types of diffusion layers 118a and 118b which differ in finished shape. It becomes therefore difficult to ensure the on current of transistors and avoid the short-channel effect. This problem would arise likewise even if dopant atoms were introduced after the removal of the hard mask.

In Example 2, the gaps "A" between adjacent gate electrodes 17 under adjacent hard masks 16$_1$ and 16$_2$ whose the curved third faces face each other is made narrower than the gaps "B" between adjacent gate electrodes under adjacent hard masks 16$_2$ and 16$_1$ whose the second faces vertically extending face each other. In addition, the exposed portion of the gate insulating film 19 which corresponds to the portion of gap "A" is made smaller in thickness than the exposed portion of the gate insulating film which corresponds to the portion of gap "B" as shown in FIG. 7. For this reason, in introducing dopant atoms (e.g., phosphorous) into the surface of the semiconductor substrate 11 through ion implantation, the surface concentration of dopant atoms, the junction depth and the area of overlap with the gate electrodes 17 tend to increase in those surface portions of the substrate which correspond to the portions of gap "A". However, since the gap "A" between the gate electrodes 17 under adjacent hard masks 16$_1$ and 16$_2$ whose the curved third faces face each other, which is large in the prospective angle, is narrow, diffusion layers 18a can be formed shallow in the junction depth, narrow in the area of overlap with the gate electrodes, and low in the concentration of dopant atoms. On the other hand, the surface concentration of dopant atoms, the junction depth and the area of overlap with the gate electrodes 17 tend to decrease in those surface portions of the substrate which correspond to the portions of the gap "B". However, since the gap "B" between the gate electrodes 17 under adjacent hard masks 16$_1$ and 16$_2$ whose the second faces vertically extending face each other, which is small in the prospective angle, is broad, diffusion layers 18b can be formed deep in the junction depth, broad in the area of overlap with the gate electrodes, and high in the concentration of dopant atoms. Thus, the repeated variations in the junction depth and the area of overlap with the gate electrodes 17 of the diffusion layers 18a and 18b can be suppressed, allowing a semiconductor device adapted to ensure the on current of transistors and avoid the short-channel effect to be manufactured.

Figure 9:
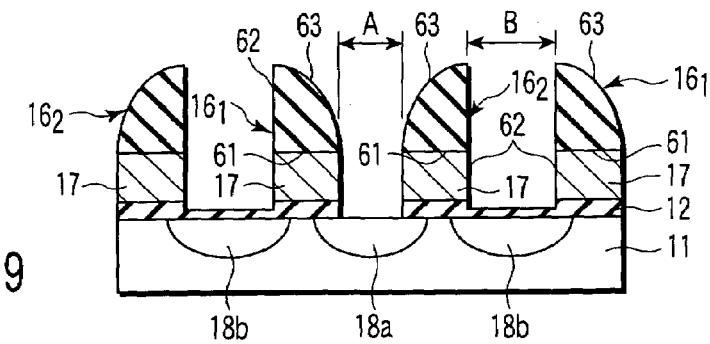
FIG. 9 is a sectional view illustrating another modification of example 2.

(2) As shown in FIG. 9, in selectively removing the exposed gate electrode conductive film 13 by means of reactive ion etching using the hard masks 16$_1$ and 16$_2$ as a mask to form the gate electrodes 17, the gap "A" between the gate electrodes under adjacent hard masks 16$_1$ and 16$_2$ whose the curved third faces face each other, which is large in the prospective angle, is made narrower than the gap "B" between the gate electrodes under adjacent hard masks 16$_1$ and 16$_2$ whose the second faces vertically extending face each other, which is small in the prospective angle. Thereby, even if that portion of the gate insulating film 12, which is located the gap "A" between the gate electrodes, is etched away, the diffusion layers 18a and 18b can be formed which are substantially uniform in the surface concentration of dopant atoms, the junction depth, and the area of overlap with the gate electrode 17.

Figure 10:
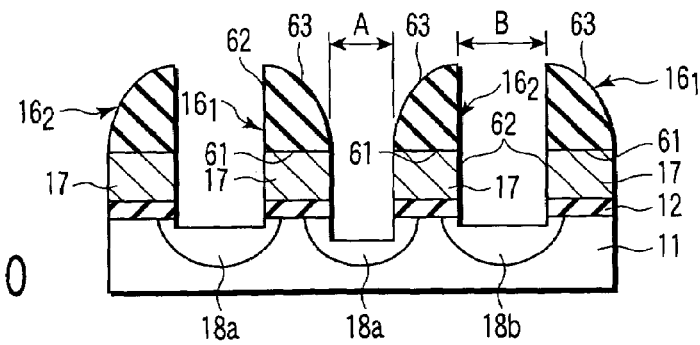
FIG. 10 is a sectional view illustrating a further modification of example 2.

(3) As shown in FIG. 10, in selectively removing the exposed gate electrode conductive film 13 by means of reactive ion etching using the hard masks 16$_1$ and 16$_2$ as a mask to form the gate electrodes 17, the gap "A" between the gate electrodes under adjacent hard masks 16$_1$ and 16$_2$ whose the curved third faces face each other, which is large in the prospective angle, is made narrower than the gap "B" between the gate electrodes under adjacent hard masks 16$_1$ and 16$_2$ whose the second faces vertically extending face each other, which is small in the prospective angle. Thereby, even if that portion of the gate insulating film 12 which is located the gap "A" between the gate electrodes and the underlying semiconductor substrate 11 are etched, the diffusion layers 18a and 18b can be formed which are substantially uniform in the surface concentration of dopant atoms, the junction depth, and the area of overlap with the gate electrode 17.

The advantages of Examples 1 and 2 remarkably appear in the case of fine transistor sizes in which the short-channel effect is a problem, and, depending on the shape of the hard masks and how to introduce impurities, in the case of fine transistor series structures in which the gate length is generally less than 100 nm.

EXAMPLE 3

Figure 11A:
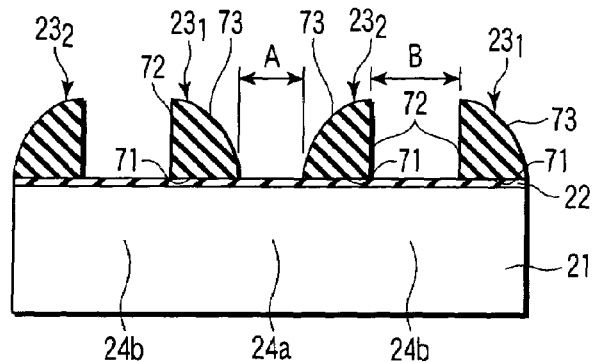
FIGS. 11A, 11B, 11C and 11D are sectional views illustrating the steps of manufacture of a semiconductor device in accordance with example 3 of the present invention.

First, as shown in FIG. 11A and FIG. 12, a semiconductor substrate 21 made of p-type monocrystalline silicon was formed on top with an insulating film (e.g., a film of silicon oxy-nitride) 22. Then, strip-like hard masks 23$_1$ and 23$_2$ made of silicon nitride were formed on the surface of the silicon oxy-nitride film 22 as in the case of Example 2. As shown in FIG. 12, each strip-like hard masks 23$_1$ and 23$_2$ has a first face 71 contacting the insulating film 22 and longitudinally extending, a second face 72 vertically extending from a long side of the first face 71, a third face 73 curved and extending between the first and second faces 71 and 72, fourth face 74 vertically extending from a short side of the first face 71 to the second and third faces 72 and 73, and fifth face 75 vertically extending from a short side of the first face 71 to the second and third faces 72 and 73 in the opposite side of the fourth face 74. The hard masks 23$_1$ of the first group and the hard masks 23$_2$ of the second group are alternately arranged, with the third face 73 of each hard masks 23$_1$ of the first group directed in a first direction shown by the arrow X$_1$ and the third face 73 of each hard masks 23$_2$ of the second group directed in a second direction by the arrow X$_2$ opposite to the first direction shown by the arrow X$_1$. A gap "A" between the third face 73 of the hard masks 23$_1$ of the first group and the third face 73 of the adjacent hard masks 23$_2$ of the second group become so narrow as to be about 40 nm at the surface of the insulating film 22. A gap "B" between the second face 72 of the hard masks 23₁ of the first group and the second face 72 of the adjacent hard masks 23₂ of the second group became so broad as to be about 60 nm. In the strip-like hard masks 23₁ and 23₂, a length of the first face 71 between one side of the first face 71 intersected with the second face 72 and other side of the first face 71 intersected with the third face 73 is about 40 nm.

Figure 11B:
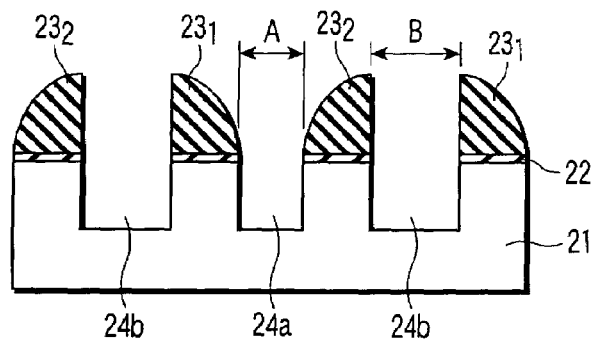

Subsequently, as shown in FIG. 11B, a selective reactive ion etching step was carried out on the silicon oxy-nitride film 22 and the semiconductor substrate 21 using the hard masks 23₁ and 23₂ as a mask to form isolation trenches 24a and 24b in portions of the semiconductor substrate 21 each of which is located between the adjacent hard masks 23₁ and 23₂.

Figure 11C:
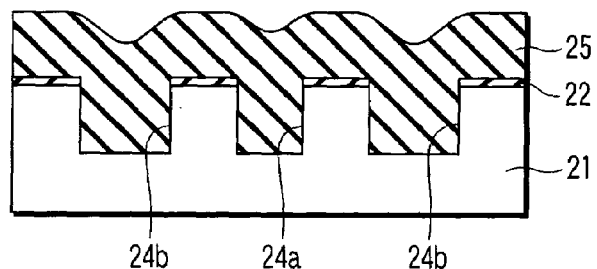

Next, as shown in FIG. 11C, the hard masks 23₁ and 23₂ were removed and then a silicon oxide film 25 was deposited at a thickness of 300 nm over the entire surface of the silicon oxy-nitride film 22 including the isolation trenches 24a and 24b.

Figure 11D:
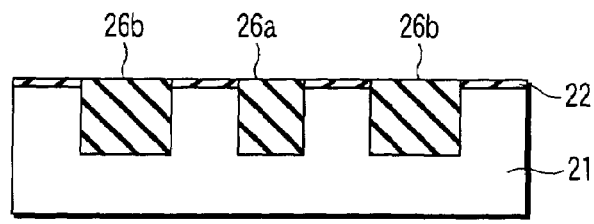

Next, as shown in FIG. 11D, the silicon oxide film 25 was etched back by means of CMP to form isolation regions 26 by filling the isolation trenches 24a and 24b with silicon oxide. After that, the silicon oxynitride film 22 was removed and then a gate insulating film, gate electrodes and diffusion layers (which are not shown) were formed to produce a semiconductor device in which transistors are arranged in parallel.

According to Example 3, by reactive ion etching using the hard masks 23₁ and 23₂ as a mask, the isolation trenches 24a and 24b of equal depth (e.g., 200 nm) can be formed in the semiconductor substrate 21. For this reason, filling the isolation trenches 24a and 24b with silicon oxide allows a isolation withstand voltage to be ensured and trench filling failures to be avoided.

That is, as shown in FIG. 13, a first group of strip-like hard masks 123₁ and a second group of strip-like hard masks 123₂ on the surface of a insulating film 122 on a semiconductor substrate 121 made of p-type monocrystalline silicon. The strip-like hard masks 123₁ and 123₂ have first to third faces 171, 172 and 173 in similar to the strip-like hard masks 23₁ and 23₂ described above. A gap between the third face 173 of the hard masks 123₁ of the first group and the third face 173 of the adjacent hard masks 123₂ of the second group is an equal, at the surface of the insulating film 122, to a gap between the second face 172 of the hard masks 123₁ of the first group and the second face 172 of the adjacent hard masks 123₂ of the second group. After that, reactive ion etching (RIE) is performed on the insulating film 122 and the semiconductor substrate 121 using the strip-like hard masks 123₁ and 123₂ as a mask. In this RIE process, the adjacent hard masks 123₁ and 123₂ whose the curved third faces 173 face each other form therebetween a region "a" in which a prospective angle of etching ions is large, whereas the adjacent hard masks 123₂ and 123₁ whose the second faces 172 vertically extending face each other form therebetween a region "b" in which a prospective angle of etching ions is small. For this reason, the isolation trenches 124a and 124b different in depth are formed in portions of the substrate 121 which correspond to the regions "a" and "b".

As a result, if the RIE process were carried out so as to make the isolation trenches shallow in order to avoid filling failures in filling the isolation trenches 124a and 124b with insulating material (e.g., silicon oxide), then the isolation trench 124b corresponding to the region "b" in which the prospective angle of etching ions is small would be made shallow, lowering the isolation withstand voltage. Conversely, if the RIE process were carried out so as to make the trenches deep in order to ensure the isolation withstand voltage, the isolation trench 124a corresponding to the region "a" in which the prospective angle of etching ions is large would be made too deep. This would result in failure to fill the isolation trenches 124a with insulating material and consequently in reduced device yield.

Therefore, as in Example 3, the gap "A" between adjacent hard masks 23₁ and 23₂ whose the curved third faces face each other is made narrower than the gaps "B" between adjacent hard masks 23₂ and 23₁ whose the second faces vertically extending face each other in reverse proportion to the prospective angle of etching ions. Thereby, at RIE time, the isolation trench 24a can be formed shallow in the portion of the semiconductor substrate 21 corresponding to the gap "A" between the adjacent hard masks 23₁ and 23₂ as shown in FIG. 11A because the prospective angle of etching ions is relatively small. On the other hand, the isolation trench 24b can be formed deep in the portion of the semiconductor substrate 21 corresponding to the gap "B" between the adjacent hard masks 23₂ and 23₁ because the prospective angle of etching ions is relatively large. As a result, repeated variations in the depth of the isolation trenches 24a and 24b can be suppressed, allowing a semiconductor device to be manufactured which ensures the device isolation withstand voltage and avoids the device isolation trench filling failure.

The method of adjusting the gaps of adjacent hard masks remains unchanged from the one in the case of ion implantation described in Example 1 with reference to FIG. 4.

Depending on the shape of the hard masks and how to process the device isolation trenches, the advantages of Example 3 remarkably appear in the case of fine transistor parallel structures in which the device isolation width is generally less than 100 nm.

EXAMPLE 4

Figure 16:
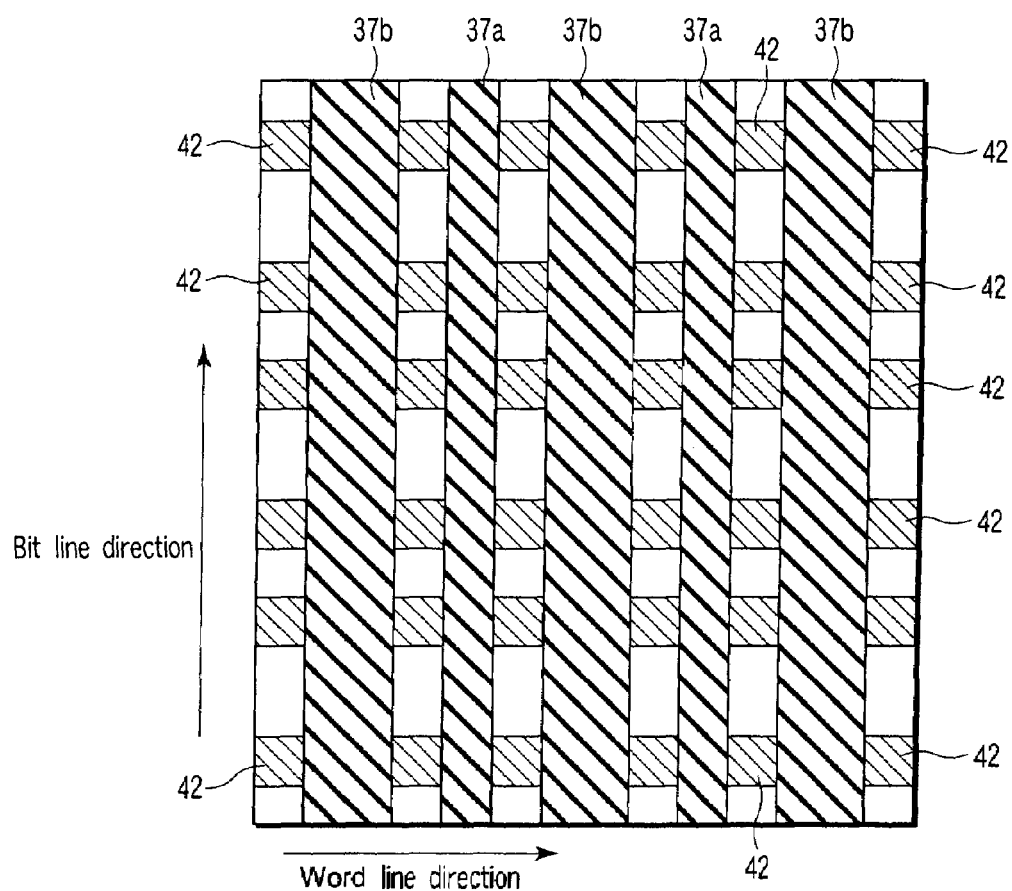
FIG. 16 is a sectional view of the NAND type nonvolatile memory cell array of FIG. 14A5 taken at the floating gate electrodes along the direction parallel to the substrate surface.

This example is directed to a method of manufacturing a NAND type nonvolatile memory cell array. FIGS. 14A1 through 14A5 are plan views, in the order of steps of manufacture, of the nonvolatile memory cell array. FIGS. 15B1 through 15B5 are sectional views taken along lines B-B (the direction of bit lines, or the direction of gate length) of FIGS. 14A1 through 14A5. FIGS. 15C1 through 15C5 are sectional views taken along lines C-C (the direction of word lines, or the direction of gate width) of FIGS. 14A1 through 14A5. FIG. 16 is a sectional view of the memory cell array of FIG. 14A5 taken at the floating gate electrodes in the direction parallel to the substrate surface.

First, as shown in FIGS. 14A1, 15B1 and 15C1, a semiconductor substrate 31 made of p-type monocrystalline silicon was formed on top with a tunnel insulating film 32 made of silicon oxy-nitride. A floating gate electrode conductive film 33 made of phosphorous-doped polycrystalline silicon was then deposited over the entire surface. Next, a repeated structure of strip-like patterns 34 made of silicon nitride was formed on the surface of the floating gate electrode conductive film 33 using standard lithographic techniques. The strip-like patterns 34 were set to 40 nm in thickness, 60 nm in width and 120 nm in spacing. Subsequently, a film of silicon oxide was deposited over the entire surface of the conductive film 33 including the strip-like patterns 34 using CVD, for example. An anisotropic etching (e.g., reactive ion etching) process was carried out on the silicon oxide film so as to leave the silicon oxide film only on the sidewalls of the strip-like patterns 34, thereby forming strip-like hard masks 35₁ and 35₂ made of silicon oxide, which were narrower than the strip-like patterns 34, on the surface of the conductive film 33.

Next, as shown in FIGS. 14A2, 15B2 and 15C2, the strip-like patterns 34 were removed by hot phosphorous acid-based etching, for example to form a first group of strip-like hard masks $35_1$ and a second group of strip-like hard masks $35_2$ as in the case of Example 2 on the surface of the conductive film 33. As shown in FIG. 15C2, each strip-like hard masks $35_1$ and $35_2$ has a first face 81 contacting the conductive film 33 and longitudinally extending, a second face 82 vertically extending from a long side of the first face 81, a third face 83 curved and extending between the first and second faces 81 and 82, fourth face (not shown) vertically extending from a short side of the first face 81 to the second and third faces 82 and 83, and fifth face (not shown) vertically extending from a short side of the first face 81 to the second and third faces 82 and 83 in the opposite side of the fourth face (not shown). The hard masks $35_1$ of the first group and the hard masks $35_2$ of the second group are alternately arranged, with the third face 83 of each hard masks $35_1$ of the first group directed in a first direction shown by the arrow $X_1$ and the third face 83 of each hard masks $35_2$ of the second group directed in a second direction by the arrow $X_2$ opposite to the first direction shown by the arrow $X_1$ as show in FIG. 14A2. A gap "A" between the third face 83 of the hard masks $35_2$ of the first group and the third face 83 of the adjacent hard masks $35_2$ of the second group become so narrow as to be about 40 nm at the surface of the conductive film 33. A gap "B" between the second face 82 of the hard masks $35_1$ of the first group and the second face 82 of the adjacent hard masks $35_2$ of the second group became so broad as to be about 60 nm. In the strip-like hard masks $35_1$ and $35_2$, a length of the first face 81 between one side of the first face 81 intersected with the second face 82 and other side of the first face 81 intersected with the third face 83 is about 40 nm. Then, the conductive film 33, the tunnel insulating film 32 and the semiconductor substrate 31 were sequentially processed by means of reactive ion etching using the hard masks $35_1$ and $35_2$ as a mask to form isolation trenches 36a and 36b. At this point, the gap "A" between adjacent hard masks $35_1$ and $35_2$ in which a prospective angle of etching ions is large was made narrow, whereas the gap "B" between the adjacent hard masks $35_2$ and $35_1$ in which a prospective angle of etching ions is small was made broad. For this reason, the isolation trenches 36a and 36b could be formed to a substantially equal depth of about 100 nm. At the same time, the tunnel insulating film 32 and the floating gate electrode conductive film 33 were patterned into the form of strips.

Next, as shown in FIGS. 14A3, 15B3 and 15C3, an isolation insulating film made of silicon oxide was deposited over the entire surface to fill the isolation trenches 36a and 36b. This silicon oxide film and the hard masks $35_1$ and $35_2$ were then etched back by means of conventional techniques such as CMP. At the same time, spaces between the tunnel insulating strips 32 and spaces between the floating gate electrode conductive strips 33 were filled with the silicon oxide, respectively. Subsequently, the top surface of the silicon oxide film was adjusted by chemical etching using dilute sulfuric acid so as to be flush with the top surface of the floating gate electrode conductive strips to form floating gate electrodes, thereby forming strip-like isolation regions 37a of about 40 nm in width and strip-like isolation regions 37b of about 60 nm in width. As shown in FIG. 15C3, the surfaces of the isolation regions 37a and 37b were flush with the surfaces of the floating gate electrode conductive strips, respectively. However, the surfaces of the isolation regions 37a and 37b may be lower than the surfaces of the floating gate electrode conductive strips by carrying out over-etching the silicon oxide constituted the isolation regions 37a and 37b. Next, an interelectrode insulating film 38 consisting of high-permittivity material, such as hafnium aluminate, and a control gate electrode conductive film 39 consisting of a composite film of phosphorous-doped silicon and tungsten silicide were deposited in this sequence.

Next, as shown in FIGS. 14A4, 15B4 and 15C4, a repeated structure of strip-like patterns 40 consisting of silicon nitride was formed on the surface of the control gate electrode conductive film 39 using conventional lithographic techniques so that they are perpendicular to the strip-like isolation regions 37a and 37b. The strip-like patterns 40 were set to 40 nm in thickness, 60 nm in width, and 120 nm in spacing. Subsequently, a film of silicon oxide was deposited at a thickness of 60 nm over the entire surface of the control gate electrode conductive film 39 including the strip-like patterns 40 by means of CVD, for example. An anisotropic etching (e.g., reactive ion etching) process was then carried out on the silicon oxide film to leave the silicon oxide film only on the sidewalls of the strip-like patterns 40, thereby forming strip-like hard masks $41_1$ and $41_2$ made of silicon oxide, which were narrower than the strip-like patterns 40, on the surface of the control gate electrode conductive film 39.

Next, as shown in FIGS. 14A5, 15B5, 15C5, and 16, the strip-like patterns 40 were removed through etching using hot phosphoric acid, for example to form a first group of strip-like hard masks $41_1$ and a second group of strip-like hard masks $41_2$ as in the case of Example 2 on the surface of the control gate electrode conductive film 39. As shown in FIG. 15B5, each strip-like hard masks $41_1$ and $41_2$ has a first face 91 contacting the control gate electrode conductive film 39 and longitudinally extending, a second face 92 vertically extending from a long side of the first face 91, a third face 93 curved and extending between the first and second faces 91 and 92, fourth face (not shown) vertically extending from a short side of the first face 91 to the second and third faces 92 and 93, and fifth face (not shown) vertically extending from a short side of the first face 91 to the second and third faces 92 and 93 in the opposite side of the fourth face (not shown). The hard masks $41_1$ of the first group and the hard masks $41_2$ of the second group are alternately arranged, with the third face 93 of each hard masks $41_1$ of the first group directed in a first direction shown by the arrow $X_1$ and the third face 93 of each hard masks $41_2$ of the second group directed in a second direction by the arrow $X_2$ opposite to the first direction shown by the arrow $X_1$ as show in FIG. 14A5. A gap "A" between the third face 93 of the hard masks $41_1$ of the first group and the third face 93 of the adjacent hard masks $41_2$ of the second group become so narrow as to be about 40 nm at the surface of the control gate electrode conductive film 39. A gap "B" between the second face 92 of the hard masks $41_1$ of the first group and the second face 92 of the adjacent hard masks $41_2$ of the second group became so broad as to be about 60 nm. In the strip-like hard masks $41_1$ and $41_2$, a length of the first face 91 between one side of the first face 91 intersected with the second face 92 and other side of the first face 91 intersected with the third face 93 is about 40 nm. Then, a reactive ion etching process was carried out using the second hard masks $41_1$ and $41_2$ as a mask to sequentially process the control gate electrode conductive film 39, the interelectrode insulating film 38 and the floating gate electrode conductive strips 33, thereby forming stacked gate structures each comprising floating gate electrodes 42 and control gate electrodes 43 with the interelectrode insulating film 38 interposed therebetween so as to be perpendicular to the isolation regions 37a and 37b. Subsequently, using the second hard masks $41_1$ and $42_2$ and the stacked gate structures as a mask, dopant atoms (e.g., n-type impurity of phosphorous) were ion implanted into the surface of the semiconductor substrate 31 to form diffusion layers 44a and 44b. At this point, the diffusion layers 44a and 44b thus formed were substantially uniform in the surface concentration of dopant atoms, the junction depth, and the area of overlap with the gate electrodes because the gap "A" between adjacent hard masks $41_1$ and $41_2$ in which a prospective angle of etching ions is large was made narrow, whereas the gap "B" between the adjacent hard masks $41_2$ and $41_1$ in which a prospective angle of etching ions is small was made broad. After that, interlayer insulating films and interconnections were formed using conventional techniques to finish a NAND type of nonvolatile memory cell array.

According to Example 4, a high-performance high-reliability nonvolatile memory cell array with a plurality of nonvolatile memory cells could be manufactured which is adapted to ensure a device isolation withstand voltage, avoid device isolation trench filling failures, ensure the on current of transistors, and avoid the short-channel effect.

The gate electrodes used in Example 1 and the hard masks used in Examples 2, 3 and 4, which have first to third faces described above, may be formed into such perspective view of these as shown in (a), (b), (c), (d), (e) and (f) of FIG. 17. That is, each gate electrode or each hard mask is fundamentally formed to a figure which has an equal length of first and second faces F1 and F2 as shown in FIG. 17 (*a*). The length of first and second faces F1 and F2 may differ in length as shown in FIG. 17 (*b*) and FIG. 17 (*c*). The curved third face F3 may be partially flat as shown in FIG. 17 (*d*). In the actual manufacture of semiconductor devices, the intersection of second face F2 and third face F3 may also be rounded as shown in FIG. 17 (*e*) and FIG. 17 (*f*). The gate electrodes or the hard masks having such a shape will offer the same advantages as with Examples 1 to 4.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

depositing a tunnel insulating film and a floating gate electrode conductive film in this sequence over an entire surface of a semiconductor substrate;

forming a first group of at least strip-like one hard mask and a second group of strip-like hard masks on the surface of the floating gate electrode conductive film, each strip-like hard mask having a first face contacting the floating gate electrode conductive film and longitudinally extending, a second face vertically extending from a long side of the first face and a third face curved and extending between the first and second faces, the at least one hard mask of the first group and the hard masks of the second group being alternately arranged, with the third face of the at least one hard mask of the first group directed in a first direction and the third face of each hard mask of the second group directed in a second direction opposite to the first direction, and a gap between the third face of the hard mask of the first group and the third face of the adjacent hard mask of the second group being narrower, at the surface of the floating gate electrode conductive film, than a gap between the second face of the hard mask of the first group and the second face of the adjacent hard mask of the second group;

carrying out selective anisotropic etching on the floating gate electrode conductive film, the tunnel insulating film, and the semiconductor substrate using the hard masks as a mask to form strip-like isolation trenches in the semiconductor substrate and to form strip-like tunnel insulating films and strip-like floating gate electrode conductive films;

filling the isolation trenches, spaces between the strip-like tunnel insulating films and spaces between the strip-like floating gate electrode conductive films with an insulating material to form strip-like isolation regions in the semiconductor substrate after or upon removing the hard masks;

depositing an interelectrode insulating film and a control gate electrode conductive film in this sequence on the surface of the strip-like floating gate electrode conductive films including strip-like isolation regions;

forming a first group of at least one strip-like hard mask and a second group of strip-like hard masks on the surface of the control gate electrode conductive film, each strip-like hard mask having a first face contacting the control gate electrode conductive film and longitudinally extending, a second face vertically extending from a long side of the first face and a third face curved and extending between the first and second faces, the at least one hard mask of the first group and the hard masks of the second group being alternately arranged, with the third face of the at least one hard mask of the first group directed in a first direction orthogonal to a longitudinal direction of the strip-like isolation regions and the third face of each hard mask of the second group directed in a second direction opposite to the first direction, and a gap between the third face of the hard mask of the first group and the third face of the adjacent hard mask of the second group being narrower, at the surface of the control gate electrode conductive film, than a gap between the second face of the hard mask of the first group and the second face of the adjacent hard mask of the second group;

selectively etching the control gate electrode conductive film, the interelectrode insulating film, and the strip-like floating gate electrode conductive films using the hard masks as a mask to form stacked gate structures each comprising a floating gate electrode, the interelectrode insulating film and strip-like control gate electrodes on the strip-like tunnel insulating films including spaces located between them and filled with insulating material; and introducing dopant atoms into the surface of the semiconductor substrate through gaps between the hard masks on the stacked gate structures to form diffusion layers in the semiconductor substrate.

2. The method according to claim 1, wherein the strip-like hard masks used as a mask for forming the isolation trenches are formed by forming strip-like patterns each having steep sidewalls on the floating gate electrode conductive film, depositing a film of hard mask material over the entire surface of the floating gate electrode conductive film including the strip-like patterns, subjecting the film of hard mask material to an anisotropic etching process so that it is left on the sidewalls of the strip-like patterns, and removing the strip-like patterns.

3. The method according to claim 2, wherein the floating gate electrode conductive film is made of impurity-doped polycrystalline silicon, and the strip-like patterns and the film of hard mask material are made of silicon nitride and silicon oxide, respectively.

4. The method according to claim 1, wherein the filling the isolation trenches with an insulating material involves depositing a isolation insulating film over the entire surface of the hard masks including the isolation trenches so as to fill up the trenches and etching back the isolation insulating film and the hard masks by means of chemical mechanical polishing.

5. The method according to claim 4, wherein the isolation insulating film is made of silicon oxide.

6. The method according to claim 1, wherein the strip-like hard masks used as a mask for forming the floating gate electrode are formed by forming strip-like patterns each having steep sidewalls on the control gate electrode conductive film, depositing a film of hard mask material over the entire surface of the control gate electrode conductive film including the strip-like patterns, subjecting the film of hard mask material to an anisotropic etching process so that it is left on the sidewalls of the strip-like patterns, and removing the strip-like patterns.

7. The method according to claim 6, wherein the floating gate electrode conductive film is made of impurity-doped polycrystalline silicon, and the strip-like patterns and the film of hard mask material are made of silicon nitride and silicon oxide, respectively.

* * * * *